(12) United States Patent
Aoki et al.

(10) Patent No.: US 11,099,413 B2
(45) Date of Patent: Aug. 24, 2021

(54) DISPLAY DEVICE

(71) Applicant: Japan Display Inc., Minato-ku (JP)

(72) Inventors: Yoshiro Aoki, Tokyo (JP); Toshiya Yamazaki, Tokyo (JP); Kazunori Yamaguchi, Tokyo (JP); Toshihiro Yanagi, Tokyo (JP); Yoshitoshi Kida, Tokyo (JP); Kazuhiro Nishiyama, Tokyo (JP); Shinichiro Oka, Tokyo (JP); Hiroyuki Kimura, Tokyo (JP); Takashi Nakamura, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/981,268

(22) Filed: May 16, 2018

(65) Prior Publication Data
US 2019/0004360 A1    Jan. 3, 2019

(30) Foreign Application Priority Data

Jun. 30, 2017 (JP) .............................. JP2017-129779

(51) Int. Cl.
*G02F 1/1333* (2006.01)
*G02F 1/1345* (2006.01)
(Continued)

(52) U.S. Cl.
CPC .... *G02F 1/133305* (2013.01); *G02F 1/13452* (2013.01); *G02F 1/136286* (2013.01);
(Continued)

(58) Field of Classification Search
CPC . H01L 51/0097; H01L 33/483; H01L 33/505; H01L 23/4985; H01L 23/8387;
(Continued)

(56) References Cited

U.S. PATENT DOCUMENTS 8,593,061 B2 * 11/2013 Yamada .............. H01L 51/5237
313/512
9,104,368 B2 * 8/2015 Ka ........................ G06F 1/1601
(Continued)

FOREIGN PATENT DOCUMENTS

CN            204303275 U      4/2015

OTHER PUBLICATIONS

Combined Chinese Office Action and Search Report dated Dec. 31, 2020 in Patent Application No. 201810694399.6 (submitting English machine translation only), citing document AO therein, 9 pages.

*Primary Examiner* — David A Zarneke
(74) *Attorney, Agent, or Firm* — Oblon, McClelland, Maier & Neustadt, L.L.P.

(57) ABSTRACT

According to one embodiment, a display device includes a first basement, a first folding line and a second folding line. The first basement has a first area which is a display area including a display element, and a second area and a third area which are non-display areas and are adjacent to the first area. The first folding line is located at a border of the first area and the second area. The second folding line is located at a border of the first area and the third area. The first folding line extends in a first direction, and the second folding line extends in a second direction intersecting the first direction.

21 Claims, 22 Drawing Sheets

(51) Int. Cl.
*G02F 1/1362* (2006.01)
*H01L 51/00* (2006.01)
*H01L 27/32* (2006.01)
*G02F 1/1343* (2006.01)
*G02F 1/1339* (2006.01)
*G02F 1/1368* (2006.01)
*H01L 51/52* (2006.01)

(52) U.S. Cl.
CPC ...... *H01L 27/3276* (2013.01); *H01L 51/0097* (2013.01); *G02F 1/1368* (2013.01); *G02F 1/13394* (2013.01); *G02F 1/13685* (2021.01); *G02F 1/133388* (2021.01); *G02F 1/134363* (2013.01); *G02F 2201/56* (2013.01); *H01L 27/3211* (2013.01); *H01L 27/3244* (2013.01); *H01L 51/5271* (2013.01); *H01L 2251/5315* (2013.01); *H01L 2251/5338* (2013.01)

(58) Field of Classification Search
CPC ........... H01L 2251/5338; H01L 51/524; H01L 51/5237; H01L 27/3276; H01L 27/4618; G02F 1/133305; G09F 9/301; G06F 1/1641; G06F 9/301
See application file for complete search history.

(56) References Cited

U.S. PATENT DOCUMENTS

| | | | | |
|---|---|---|---|---|
| 9,128,312 | B2 * | 9/2015 | Lee | G02F 1/1333 |
| 9,275,561 | B2 * | 3/2016 | Kim | G09F 3/10 |
| 9,291,843 | B2 * | 3/2016 | Yeo | G02F 1/133305 |
| 9,349,758 | B2 | 5/2016 | Ki et al. | |
| 9,414,463 | B2 * | 8/2016 | Ka | G06F 1/1601 |
| 9,430,180 | B2 * | 8/2016 | Hirakata | G06F 3/0412 |
| 9,535,522 | B2 * | 1/2017 | Ahn | G06F 3/044 |
| 9,706,607 | B2 * | 7/2017 | Kim | H05B 33/04 |
| 9,766,737 | B2 * | 9/2017 | Ahn | G06F 3/041 |
| 9,892,667 | B2 * | 2/2018 | Arima | G09G 3/325 |
| 9,972,669 | B2 * | 5/2018 | Hong | H01L 27/3246 |
| 9,980,326 | B2 * | 5/2018 | Kim | H05B 33/04 |
| 10,061,356 | B2 * | 8/2018 | Jin | G06F 1/1637 |
| 10,128,323 | B2 * | 11/2018 | Yang | G09F 9/33 |
| 10,638,619 | B2 * | 4/2020 | Seo | G06F 1/1637 |
| 2007/0200223 | A1 * | 8/2007 | Konishi | H01L 24/27 257/706 |
| 2013/0002583 | A1 * | 1/2013 | Jin | G06F 1/1637 345/173 |
| 2015/0062927 | A1 * | 3/2015 | Hirakata | H01L 51/0097 362/362 |
| 2016/0093685 | A1 | 3/2016 | Kwon et al. | |
| 2017/0170253 | A1 * | 6/2017 | Kim | H01L 51/0097 |
| 2018/0331171 | A1 * | 11/2018 | Kim | H01L 27/3223 |
| 2019/0067404 | A1 * | 2/2019 | Lee | H01L 51/5056 |

* cited by examiner

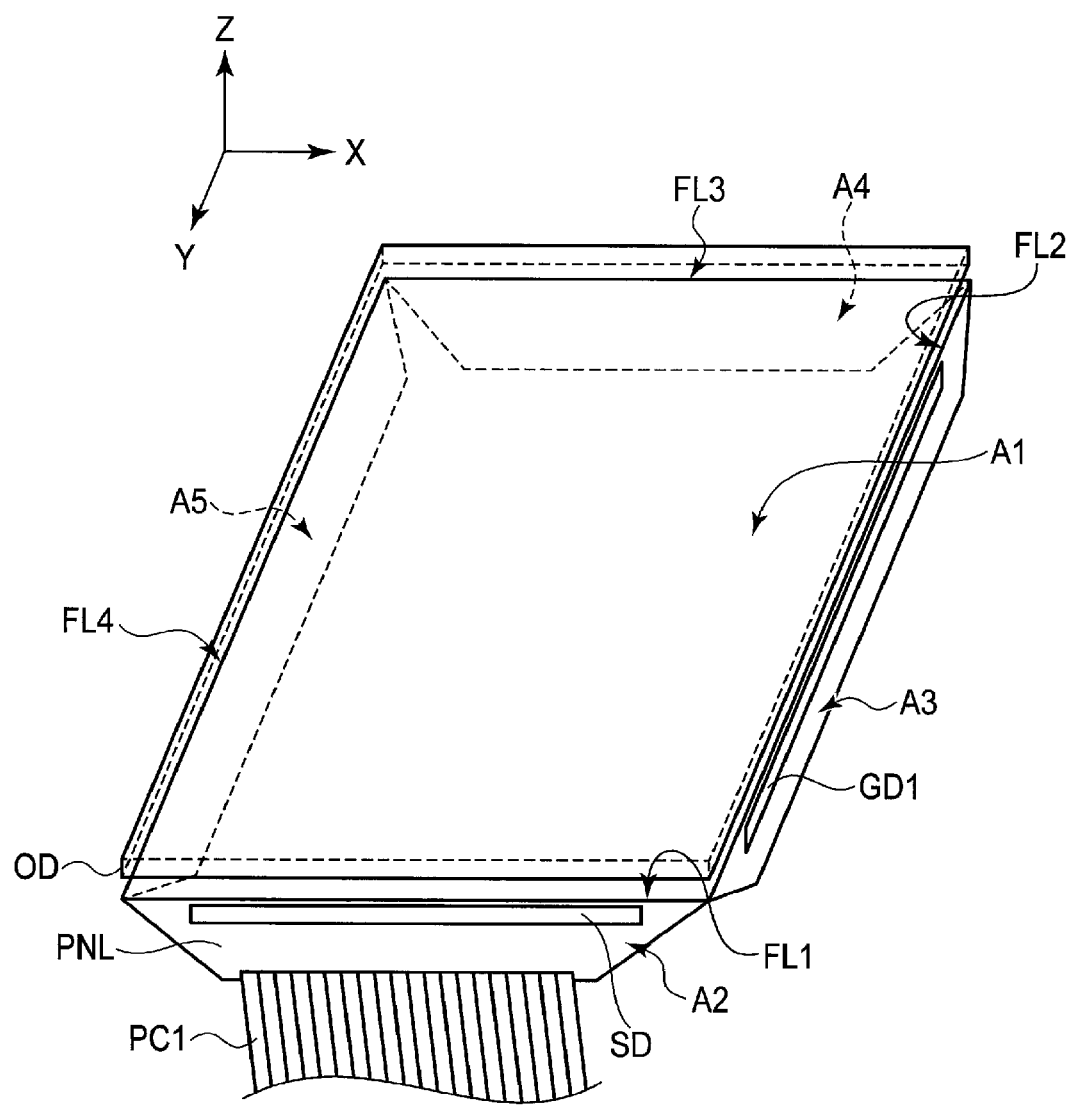
F I G. 1

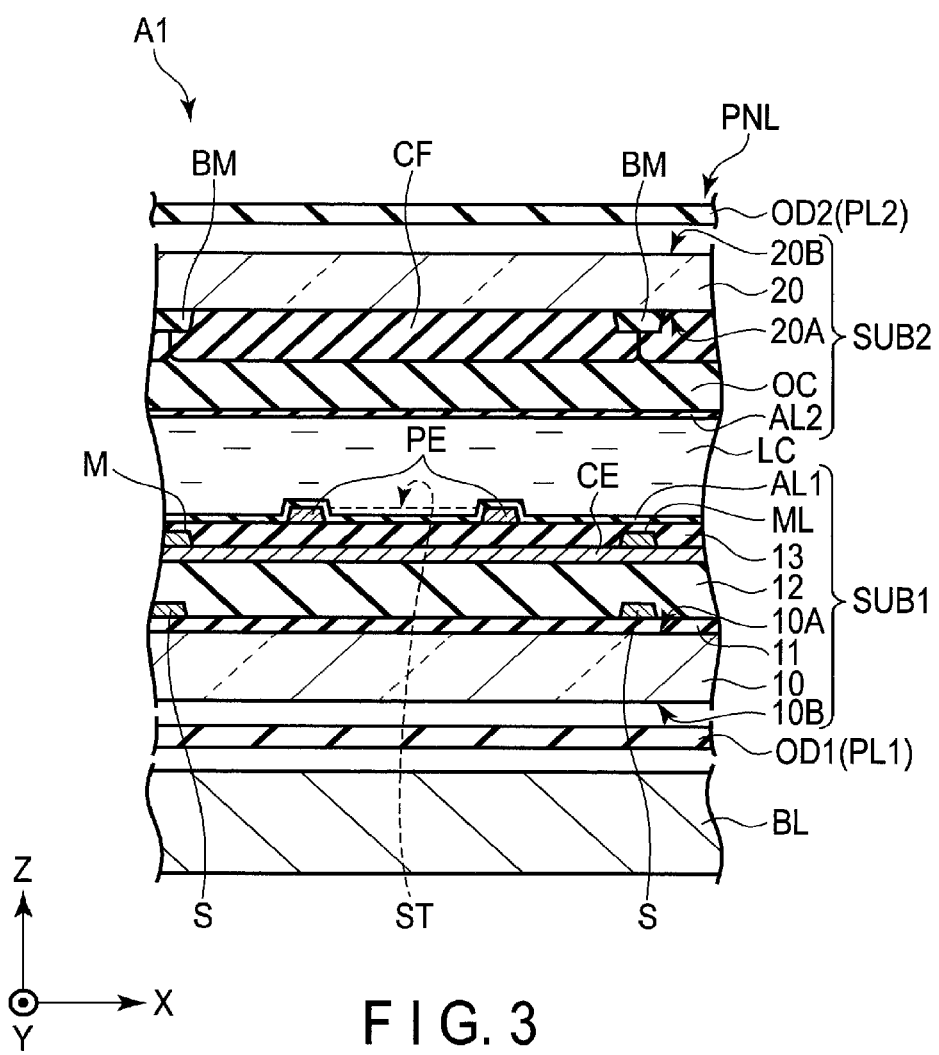
F I G. 3

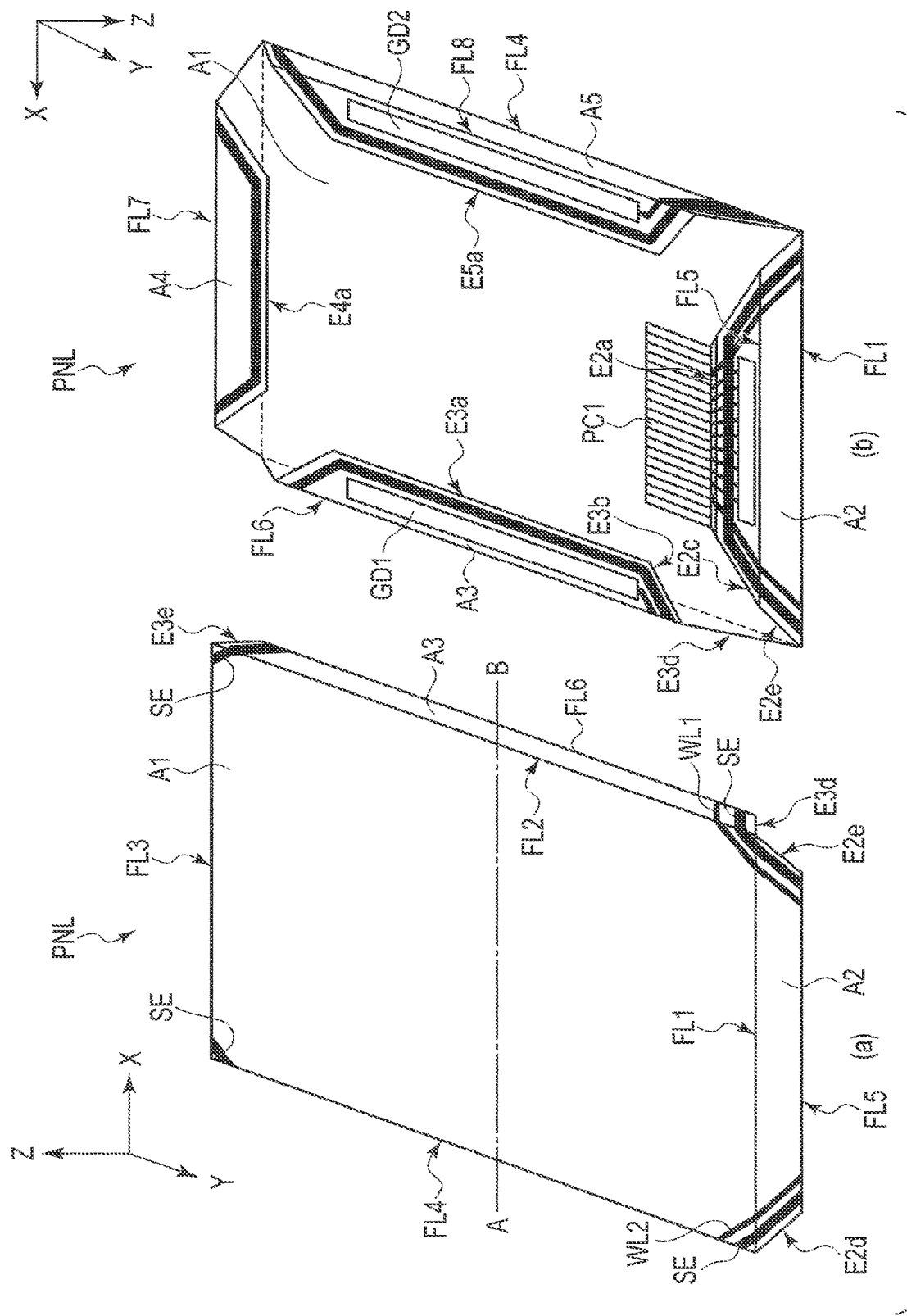
F I G. 6

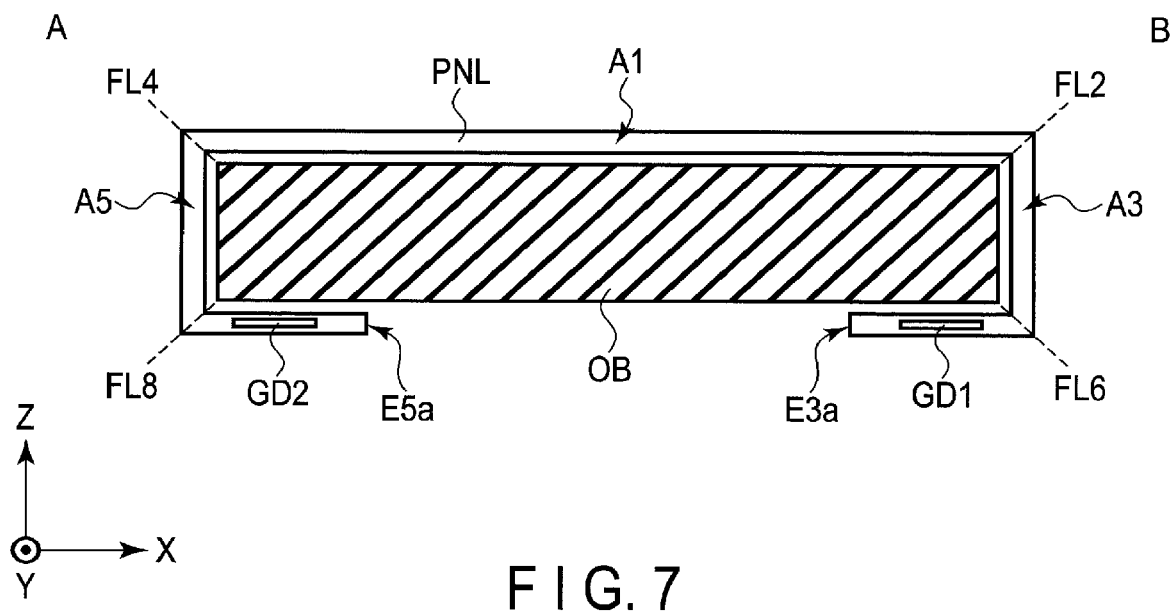
F I G. 7

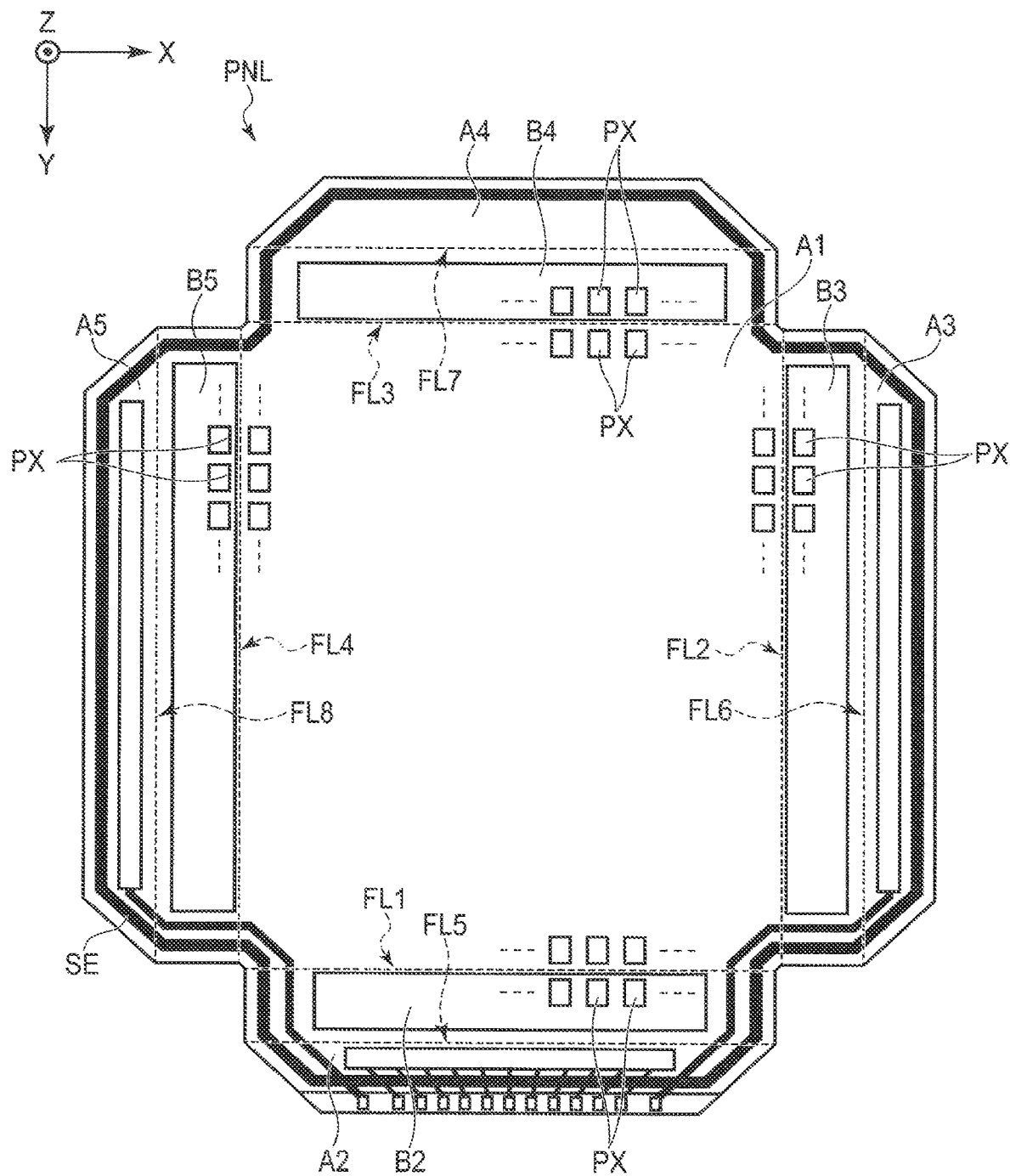
F I G. 12

DISPLAY DEVICE

CROSS-REFERENCE TO RELATED APPLICATIONS

This application is based upon and claims the benefit of priority from Japanese Patent Application No. 2017-129779, filed Jun. 30, 2017, the entire contents of which are incorporated herein by reference.

FIELD

Embodiments described herein relate generally to a display device.

BACKGROUND

In personal digital assistants as represented by smartphones, as the amount of information to be handled is increased, the size of a display screen becomes one of important performance indexes. On the other hand, personal digital assistants as hardware need to be light and compact. Therefore, as a display device to be installed in a personal digital assistant, etc., there is demand for a display device in which a non-display area is reduced as small as possible, that is, a display area accounts for a large proportion. However, a built-in circuit which drives a display element, a routing line, a connector which connects to an external device cannot be completely removed.

BRIEF DESCRIPTION OF THE DRAWINGS

FIG. 1 is a perspective view showing an example of the structure of a display device DSP according to the present embodiment.

FIG. 3 is a sectional view of an area A1 shown in FIG. 2.

FIG. 6 is a perspective view in a case where the display panel PNL shown in FIG. 5 is folded along folding lines.

FIG. 7 is a sectional view taken along line A-B of FIG. 6.

FIG. 12 is a development view showing the fourth modification of the display panel PNL.

DETAILED DESCRIPTION

Figure 2:
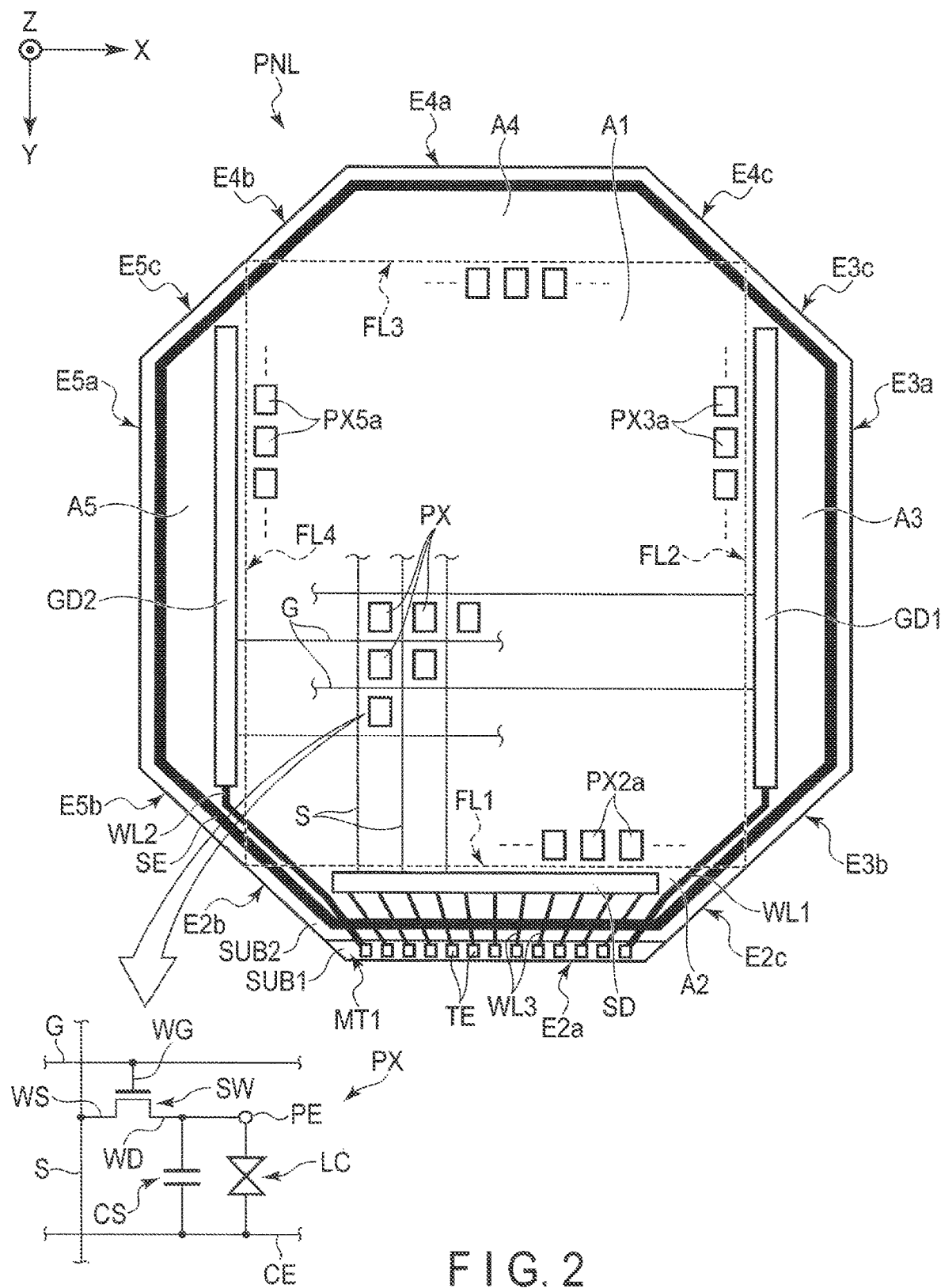
FIG. 2 is a development view of a display panel PNL shown in FIG. 1.

In general, according to one embodiment, a display device includes a first basement, a first folding line and a second folding line. The first basement has a first area which is a display area including a display element, and a second area and a third area which are non-display areas and are adjacent to the first area. The first folding line is located at a border of the first area and the second area. The second folding line is located at a border of the first area and the third area. The first folding line extends in a first direction, and the second folding line extends in a second direction intersecting the first direction.

According to another embodiment, a display device includes a first area, a second area and a third area, a first folding line, a second folding line, a third folding line and a fourth folding line. The first area is a display area including a display element. The second are and a third area are adjacent to the first area. The first folding line is located at a border of the first area and the second area and extends in a first direction. The second folding line is located at a border of the first area and the third area and extends in a second direction intersecting the first direction. The third folding line is located in the second area and extends in the first direction. The fourth folding line is located in the third area and extends in the second direction. The second area has a first reserve display area located between the first folding line and the third folding line. The third area has a second reserve display area located between the second folding line and the fourth folding line.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

FIG. 1 is a perspective view showing an example of the structure of a display device DSP according to the present embodiment. FIG. 1 shows a three-dimensional space which is defined by a first direction X, a second direction Y which is perpendicular to the first direction X, and a third direction Z which is perpendicular to the first direction X and the second direction Y. The first direction X and the second direction Y may intersect each other at an angle other than an angle of 90 degrees. In the present embodiment, the third direction Z is defined as above and the direction opposite to the third direction Z is defined as below.

In the present embodiment, a display device DSP is a liquid crystal display device including a liquid crystal layer, for example. However, the display device DSP may be another display device such as an organic electroluminescent (EL) display device including an organic EL element or an electronic paper-type display device including an electrophoretic element.

The display device DSP includes a display panel PNL, a wiring substrate PC1 and an optical element OD.

The display panel PNL is folded along at least two intersecting directions. In the example illustrated, the display panel PNL is folded along four folding lines FL1, FL3, FL3 and FL4. The folding lines FL1 and FL3 extend in the first direction X. The folding lines FL2 and FL4 extend in the second direction Y. In the present embodiment, a fold means that two intersecting planes are formed in one member and the width of a curved area between the two intersecting planes is sufficiently less than the widths of the planes. In the fold of the display panel PNL, the radius of curvature is about the thickness of the display panel PNL, for example.

As the display panel PNL is folded along the folding lines FL1, FL2, FL3 and FL4, an area A1 as a main surface and areas A2, A3, A4 and A5 located on side surfaces are formed. In the present embodiment, the area A1 is a display area which displays an image substantially across the entire surface. On the other hand, the areas A2, A3, A4 and A5 are non-display areas.

The area A1 is a quadrangle and is, for example, a rectangle. The folding lines FL1, FL2, FL3 and FL4 correspond to four sides of the area A1. In other words, the folding lines FL1, FL2, FL3 and FL4 correspond to the borders between the display area and the non-display areas. More specifically, the folding line FL1 is located at the border between the area A1 and the area A2. The folding line FL2 is located at the border between the area A1 and the area A3. The folding line FL3 is located at the border between the area A1 and the area A4. The folding line FL4 is located at the border between the area A1 and the area A5. The area A1 is not limited to a quadrangle and may be another polygon.

All the folding lines FL1, FL2, FL3 and FL4 are downward folding lines. That is, the areas A2, A3, A4 and A5 are folded downward (that is, on the opposite side to the display surface) from the area A1, respectively, along the folding lines FL1, FL2, FL3 and FL4. All the angles formed between the area A1 and the areas A2, A3, A4 and A5 are about 90 degrees, for example. The angles formed between the area A1 and the areas A2, A3, A4 and A5 may be other than 90 degrees and may be different from each other. In some cases, the areas A2, A3, A4 and A5 may overlap the back surface side of the area A1. In a state where the display panel PNL is folded, the areas A2, A3, A4 and A5 are separated from each other.

The optical element OD has an area substantially equal to that of the area A1 and is provided directly above the area A1. That is, the area A1 entirely overlaps the optical element OD. On the other hand, the areas A2, A3, A4 and A5 do not overlap the optical element OD. In the example illustrated, the display panel PNL includes a source driver SD and a gate driver GD1 which drive the display device DSP. For example, the source driver SD is formed in the area A2, and the gate driver GD1 is formed in the area A3. If the areas A2, A3, A4 and A5 are located on the back surface side of the area A1, the source driver SD and the gate driver GD1 overlap the back surface side of the area A1.

The wiring substrate PC1 is mounted on the area A2. This wiring substrate PC1 is a flexible substrate, for example. As the flexible substrate applicable to the present embodiment, at least part of the substrate includes a flexible portion formed of a bendable material. For example, the wiring substrate PC1 may be a flexible substrate which is entirely formed as a flexible portion, or the wiring substrate PC1 may be a rigid flexible substrate which includes a rigid portion formed of a rigid material such as glass epoxy and a flexible portion formed of a bendable material such as polyimide.

FIG. 2 is a development view of the display panel PNL shown in FIG. 1. FIG. 2 shows a plane parallel to an X-Y plane which is defined by the first direction X and the second direction Y. In plan views, downward folding lines will be shown by broken lines and upward folding lines will be shown by dashed-dotted lines.

The display panel is substantially an octagon, for example. In the example illustrated, the display panel PNL has the area A1 and the areas A2, A3, A4 and A5 which are adjacent to the area A1. The area A2 and the area A4 are opposed to each other across the area A1 in the second direction Y. The area A3 and the area A5 are opposed to each other across the area A1 in the first direction X.

The folding line FL1 is located at the border between the area A1 and the area A2. The folding line FL2 is located between the area A1 and the area A3. The folding line FL3 is located at the border between the area A1 and the area A4. The folding line FL4 is located at the border between the area A1 and the area A5. The folding lines FL1 and FL3 extend in the first direction X. The folding lines FL2 and FL4 extend in the second direction Y. For example, the folding line FL1 and the folding line FL3 have the same length. Further, the folding line FL2 and the folding line FL4 have the same length. In the example illustrated, the length of the folding lines FL1 and FL3 is less than the length of the folding lines FL2 and FL4.

The areas A2, A3, A4 and A5 are trapezoids, for example. The areas A2, A3, A4 and A5 have edges E2a, E3a, E4a and E5a located on the opposite side to the area A1, respectively. For example, the edges E2a and E4a extend in the first direction X. The edges E3a and E5a extend in the second direction Y. The length of the edges E2a and E4a in the first direction X is less than the length of the folding lines FL1 and FL3. Further, the length of the edges E3a and E5a in the second direction Y is less than the length of the folding lines FL2 and FL4.

The area A2 is located between the folding line FL2 and the folding line FL4 in the first direction X. That is, an edge E2b of the area A2 on the area A5 side does not extend beyond the folding line FL4. An edge E2c of the area A2 on the area A3 side does not extend beyond the folding line FL2. In the example illustrated, the edge E2b linearly extends from one end of the edge E2a to one end of the folding line FL1. Further, the edge E2c linearly extends from the other end of the edge E2a to the other end of the folding line FL1.

Similarly to the area A2, the area A4 is located between the folding line FL2 and the folding line FL4 in the first direction X. That is, an edge E4b of the area A4 on the area A5 side does not extend beyond the folding line FL4. An edge E4c of the area A4 on the area A3 side does not extend beyond the folding line FL2. In the example illustrated, the edge E4b linearly extends from one end of the edge E4a to one end of the folding line FL3. Further, the edge E4c linearly extends from the other end of the edge E4a to the other end of the folding line FL3.

The area A3 is located between the folding line FL1 and the folding line FL3 in the second direction Y. That is, an edge E3b of the area A3 on the area A2 side does not extend beyond the folding line FL1. An edge E3c of the area A3 on the area A4 side does not extend beyond the folding line FL3. In the example illustrated, the edge E3b linearly extends from one end of the edge E3a to one end of the folding line FL2. Further, the edge E3c linearly extends from the other end of the edge E3a to the other end of the folding line FL2.

Similarly to the area A3, the area A5 is located between the folding line FL1 and the folding line FL3 in the second direction Y. That is, an edge E5b of the area A5 on the area A2 side does not extend beyond the folding line FL1. An edge E5c of the area A5 on the area A4 side does not extend beyond the folding line FL3. In the example illustrated, the edge E5b linearly extends from one end of the edge E5a to one end of the folding line FL4. Further, the edge E5c linearly extends from the other end of the edge E5a to the other end of the folding line FL4.

In the example illustrated, the edge E2c and the edge E3b are located on the same straight line. The edge E3c and the edge E4c are located on the same straight line. The edge E4b and the edge E5c are located on the same straight line. The edge E5b and the edge E2c are located on the same straight line.

The display panel PNL includes a plurality of scanning lines G, a plurality of signal lines S and a plurality of pixels PX which are electrically connected thereto in the area A1. Here, the pixel PX corresponds to the smallest unit which is individually controllable in accordance with a pixel signal. In the example illustrated, the scanning lines G extend in the first direction X and are arranged at intervals in the second direction Y. The signal lines S extend in the second direction Y and are arranged at intervals in the first direction X. The pixels PX are arranged in a matrix in the first direction X and the second direction Y.

Each pixel PX includes a switching element SW, a pixel electrode PE, a common electrode CE, a liquid crystal element (a liquid crystal layer which will be described later) LC, etc., as shown on the lower side of the drawing. The switching element SW is composed of a thin-film transistor (TFT), for example. Each scanning line G is connected to the switching elements SW in the pixels PX which are arranged in the first direction X. Each signal S is connected to the switching elements SW in the pixels PX which are arranged in the second direction Y. The pixel electrodes PE are electrically connected to the switching elements SW. Each pixel electrode PE is opposed to the common electrode CE which is arranged across the pixels PX, and drives the liquid crystal layer LC by an electric field generated between the pixel electrode PE and the common electrode CE. For example, storage capacitance CS is formed between an electrode at the same potential as that of the common electrode CE and an electrode at the same potential as that of the pixel electrode PE.

Further, the display panel PNL includes the source driver SD and the gate drivers GD1 and GD2 which drive the pixels PX in the non-display areas. In the example illustrated, the source driver SD is formed in the area A2 and extends in the first direction X. The gate driver GD1 is formed in the area A3 and extends in the second direction Y. The gate driver GD2 is formed in the area A5 and extends in the second direction Y. The signal lines S extend to the area A2 and are connected to the source driver SD. The scanning lines G extend to the area A3 or the area A5 and are connected to the gate driver GD1 or the gate driver GD2. In the example illustrated, the scanning lines G connected to the gate driver GD1 and the scanning lines G connected to the gate driver GD2 are alternately arranged in the second direction Y. Note that the signal lines S and the scanning lines G linearly extend in the example illustrated but may be partially winding.

The folding lines FL1, FL2, FL3 and FL4 are arranged along the pixels PX located at the outermost periphery. In other words, the pixels PX are not arranged between the folding line FL1 and the edge E2a, between the folding line FL2 and the edge E3a, between the folding line FL3 and the edge E4a and between the folding line FL4 and the edge E5a. In the example illustrated, the folding line FL1 is located between pixels PX2a located at the outermost periphery and the source driver SD. The folding line FL2 is located between pixels PX3a located at the outermost periphery and the gate driver GD1. The folding line FL4 is located between pixels PX5a located at the outermost periphery and the gate driver GD2. Here, the pixels PX2a are those of the pixels PX arranged in the first direction X which are closest to the edge E2a. The pixels PX3a are those of the pixels PX arranged in the second direction Y which are closest to the edge E3a. The pixels PX5a are those of the pixels PX arranged in the second direction Y which are closest to the edge E5a. All the folding lines FL1, FL2, FL3 and FL4 do not intersect the source driver SD and the gate drivers GD1 and GD2.

The display panel PNL is composed of the first substrate SUB1 and the second substrate SUB2. The signal lines S, the scanning lines G, the switching elements SW, the source driver SD, the gate drivers GD1 and GD2, etc., are formed on the first substrate SUB1. The first substrate SUB1 includes a mounting portion MT1 which extends beyond the second substrate SUB2 in the second direction Y. In the example illustrated, the mounting portion MT1 is located in the area A2 and is provided along the edge E2a. The mounting portion MT1 includes a plurality of terminals TE which electrically connect the display panel PNL to the wiring substrate PC1 shown in FIG. 1, etc.

The first substrate SUB1 and the second substrate SUB2 are opposed to each other in the third direction Z and are attached to each other by the sealant SE. The sealant SE is provided in the shape of a substantially octagonal frame along the outer periphery of the display panel PNL. The liquid crystal layer LC is located within an area surrounded by the sealant SE. In the example illustrated, part of the sealant SE overlaps the area A1. More specifically, the sealant SE extends from the area A2 to the area A3 through the area A1, extends from the area A3 to the area A4 through the area A1, extends from the area A4 to the area A5 through the area A1 and extends from the area A5 to the area A2 thorough the area A1. In other words, the sealant SE intersects the folding lines FL1, FL2, FL3 and FL4 twice. In the example illustrated, the sealant SE is located between the source driver SD and the edge E2a in the area A2, is located between the gate driver GD1 and the edge E3a in the area A3 and is located between the gate driver GD2 and the edge E5a in the area A5.

In the example illustrated, a wiring line WL1 connected to the gate driver GD1 and a wiring line WL2 connected to the gate driver GD2 extend to the mounting portion MT1 through the area A1. That is, the wiring line WL1 intersects the folding lines FL2 and FL1 once. The wiring line WL1 is located on the inner side from the sealant SE at least in the areas A3 and A1. The wiring line WL2 intersects the folding lines FL4 and FL1 once. The wiring line WL2 is located on the inner side from the sealant SE at least in the areas A5 and A1. Wiring lines WL3 connected to the source driver SD extend toward the mounting portion MT1 in the area A2. In the example illustrated, the wiring lines WL1, WL2 and WL3 intersect the sealant SE between the source driver SD and the edge E2a. The wiring line WL1 is electrically connected to the liquid crystal layer LC which functions as a display element via the gate driver GD1. The wiring line WL2 is electrically connected to the liquid crystal layer LC which functions as a display element via the gate driver GD2.

FIG. 3 is a sectional view of the area A1 shown in FIG. 2. This is a sectional view of the display device DSP taken in the third direction Z. The illustrated display panel PNL conforms to a display mode which mainly uses a lateral electric field substantially parallel to the main surfaces of substrates. The main surfaces of substrates here correspond to a plane parallel to the X-Y plane.

The first substrate SUB1 includes a basement 10, the signal lines S, the common electrode CE, metal layers ML, the pixel electrodes PE, an insulating layer 11, an insulating layer 12, an insulating layer 13, a first alignment film AL1, etc. The basement 10 is formed of an organic material such as polyimide, for example. The basement 10 has a first surface 10A which is opposed to the second substrate SUB2 and a second surface 10B which is opposite to the first surface 10A. Here, the switching elements and the scanning lines, and various insulating layers, etc., interposed therebetween are not illustrated.

The insulating layer 11 is located on the basement 10, that is, on the first surface 10A side. The scanning lines and a semiconductor layer of the switching element which are not illustrated are located between the basement 10 and the insulating layer 11. The signal lines S are located on the insulating layer 11. The insulating layer 12 is located on the signal lines S and the insulating layer 11. The common electrode CE is located on the insulating layer 12. The metal layers ML contact the common electrode CE directly above the signal lines S. The metal layers ML are located on the common electrode CE in the example illustrated but may be located between the common electrode CE and the insulating layer 12. The insulating layer 13 is located on the common electrode CE and the metal layers ML. The pixel electrodes PE are located on the insulating layer 13. The pixel electrodes PE are opposed to the common electrode CE via the insulating layer 13. Further, the pixel electrodes PE have slits ST at positions opposed to the common electrode CE, respectively. The first alignment film AL1 covers the pixel electrodes PE and the insulating layer 13.

The scanning lines, the signal lines S and the metal layers ML may be formed of a metal material such as molybdenum, tungsten, titanium or aluminum and may have a single layer structure or a multilayer structure. The common electrode CE and the pixel electrodes PE are formed of a transparent conductive material such as ITO or IZO. The insulating layer 11 and the insulating layer 13 are inorganic insulating layers, and the insulating layer 12 is an organic insulating layer.

The structure of the first substrate SUB' is not limited to the example illustrated, and the pixel electrodes PE may be located between the insulating layer 12 and the insulating layer 13 and the common electrode CE may be located between the insulating layer 13 and the first alignment film AL1. In that case, the pixel electrodes PE have the shape of a flat plate having no slit, and the common electrode CE has slits opposed to the pixel electrodes PE. Alternatively, the pixel electrode PE and the common electrode CE may have the shape of a comb and may be engaged with each other.

The second substrate SUB2 includes a basement 20, a light-shielding layer BM, color filters CF, an overcoat layer OC, a second alignment film AL2, etc. The basement 20 is formed of an organic material such as polyimide, for example. The basement 20 has a first surface 20A which is opposed to the first substrate SUB1 and a second surface 20B which is opposite to the first surface 20A.

The light-shielding layer BM and the color filters CF are located on the first surface side 20A of the basement 20. The light-shielding layer BM partitions the pixels PX. In the example illustrated, the light-shielding layer BM is located directly above the signal lines S. The color filters CF are opposed to the pixel electrodes PE and partially overlap the light-shielding layer BM. The color filters CF include a red color filter, a green color filter, a blue color filter, etc. The overcoat layer OC covers the color filters CF. The second alignment film AL2 covers the overcoat layer OC.

The color filters CF may be arranged on the first substrate SUB1 instead. The color filters CF may include color filters corresponding to four or more colors. A pixel which displays white may be provided with a white color filter or an uncolored resin material or may be provided with the overcoat layer OC without any color filter. Further, the light-shielding layer BM may be formed on the overcoat layer OC.

A first optical element OD1 including the first polarizer PL1 is located on the second surface 10B side, that is, between the basement 10 and an illumination device BL. A second optical element OD2 including a second polarizer PL2 is located on the second surface 20B side. The first optical element OD1 and the second optical element OD2 may include retardation films, respectively, when needed.

The display panel PNL may conform to a display mode which uses a longitudinal electric field perpendicular to the main surfaces of substrates, a display mode which uses an oblique electric field inclined with respect to the main surfaces of substrates, or a display mode which uses a combination thereof. In the display mode using the longitudinal electric field or the oblique electric field, for example, the display panel PNL may adopt a structure in which one of the pixel electrode PE and the common electrode CE is provided on the first substrate SUB1 and the other one of the pixel electrode PE and the common electrode CE is provided on the second substrate SUB2.

Figure 4:
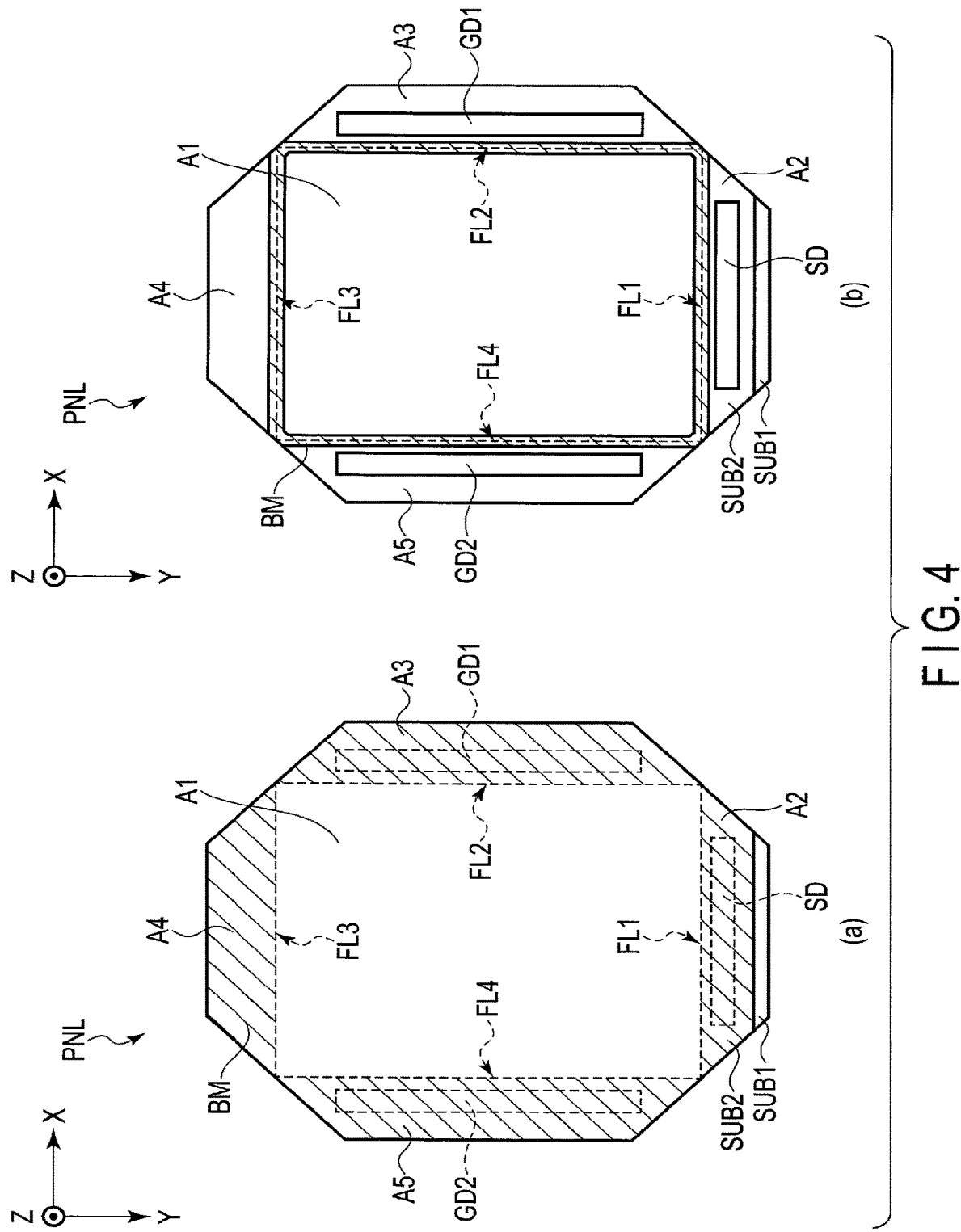
FIG. 4 is a plan view showing examples of the arrangement of a light-shielding layer BM provided in a second substrate SUB2.

FIG. 4 is a plan view showing examples of the arrangement of the light-shielding layer BM provided in the second substrate SUB2.

In the example shown in FIG. 4 (a), the light-shielding layer BM is provided through substantially the entire surfaces of the areas A2, A3, A4 and A5 as shown by diagonal lines in the drawing. In the area A1, the light-shielding layer BM doesn't exist in the opening of the pixel PX. In this structure, the borders between the area A1 and the areas A2, A3, A4 and A5 correspond to the borders between an area in which the light-shielding layer BM is not provided and areas in which the light-shielding layer BM is provided. The folding lines FL1, FL2, FL3 and FL4 are located in such a manner as to substantially overlap the inner periphery of the light-shielding layer BM. The source driver SD and the gate drivers GD1 and GD2 are located below the light-shielding layer BM and entirely overlap the light-shielding layer BM.

In the example shown in FIG. 4 (b), the light-shielding layer BM has the shape of a frame which surrounds the area A1. If the light-shielding layer BM is significantly narrow, the light-shielding layer BM can be regarded as the border between the display area and the non-display areas. The folding lines FL1, FL2, FL3 and FL4 are located in such a manner as to substantially overlap the frame-like light-shielding layer BM. The light-shielding layer BM may be omitted.

According to the present embodiment, the display panel PNL is folded along the pixels PX located at the outermost periphery. The area A1 as the display area corresponds to an area surrounded by the folding lines FL1 and FL3 which extend in the first direction X and the folding lines FL2 and FL4 which extend in the second direction Y. Therefore, the pixels PX are arranged substantially on the entire main surface of the folded display panel PNL. On the other hand, the source driver SD and the gate drivers GD1 and GD2 are located on the side surfaces. Consequently, the frame of the display device can be narrowed.

Further, the areas A2 and A4 do not extend beyond the folding lines FL2 and FL4, and the areas A3 and A5 do not extend beyond the folding lines FL1 and FL3. According to this structure, the display panel PNL can be easily folded since the areas A2, A3, A4 and A5 will not interfere with each other.

(First Modification)

Figure 5:
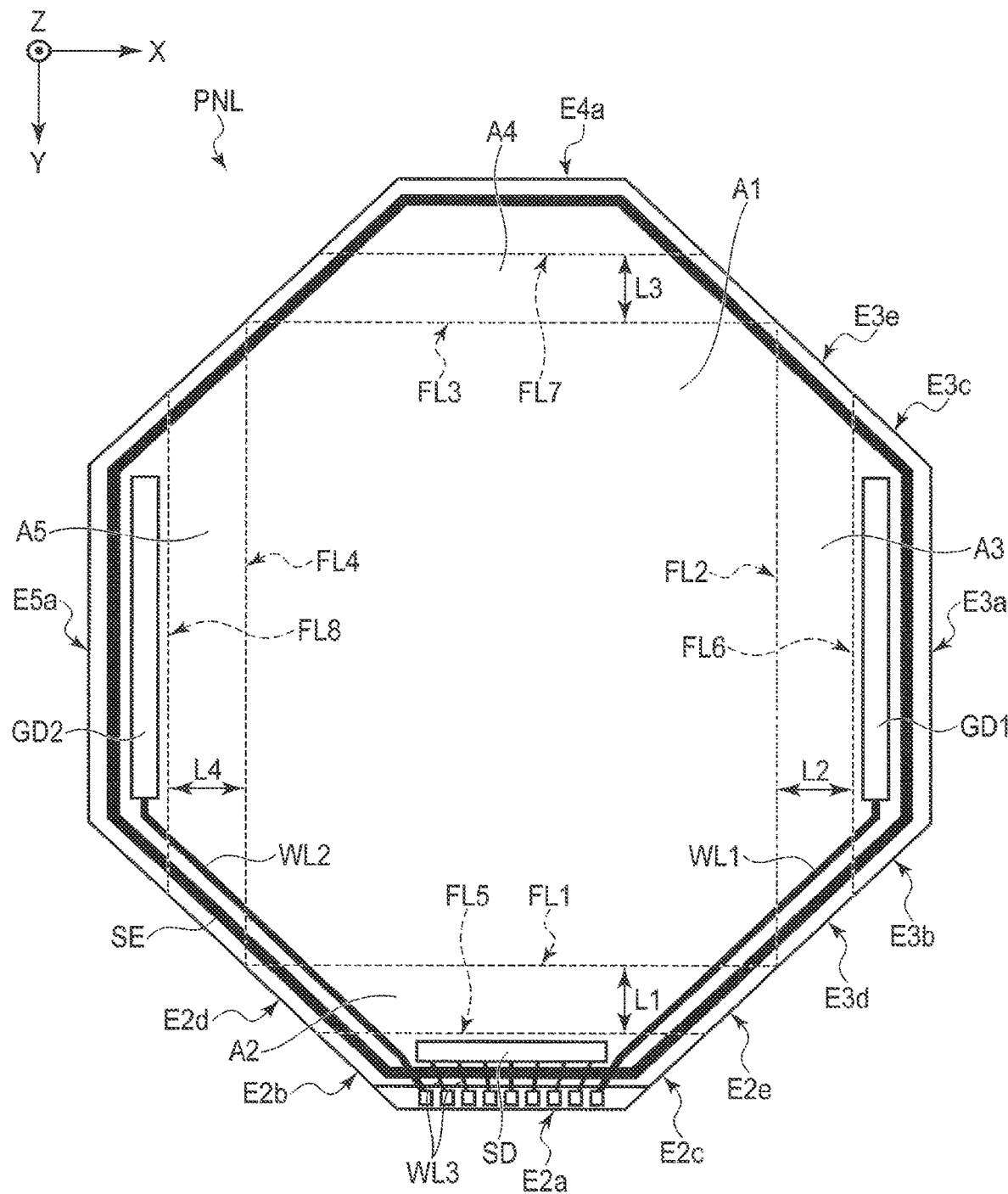
FIG. 5 is a development view showing the first modification of the display panel PNL.

FIG. 5 is a development view showing the first modification of the display panel PNL. The first modification differs from the example shown in FIG. 2 in that the display panel PNL further includes folding lines FL5, FL6, FL7 and FL8 in addition to folding lines FL1, FL2, FL3 and FL4.

All the folding lines FL5, FL6, FL7 and FL8 are downward folding lines. The folding lines FL5, FL6, FL7 and FL8 are located in the areas A2, A3, A4 and A5, respectively. More specifically, the folding line FL5 extends in the first direction X between the folding line FL1 and the edge E2a. The folding line FL6 extends in the second direction Y between the folding line FL2 and the edge E3a. The folding line FL7 extends in the first direction X between the folding line FL3 and the edge E4a. The folding line FL8 extends in the second direction Y between the folding line FL4 and the edge E5a.

For example, a distance L1 between the folding line FL5 and the folding line FL1, a distance L2 between the folding line FL6 and the folding line FL2, a distance L3 between the folding line FL7 and the folding line FL3 and a distance L4 between the folding line FL8 and the folding line FL4 are substantially equal to each other. Here, the distances L1 and L3 correspond to a distance in the second direction Y, and the distances L2 and L4 correspond to a distance in the first direction X.

In the example illustrated, the source driver SD is located between the folding line FL5 and the edge E2a. Further, the gate driver GD1 is located between the folding line FL6 and the edge E3a, and the gate driver GD2 is located between the folding line FL8 and the edge E5a.

The sealant SE is provided in the shape of a substantially octagonal frame along the outer periphery of the display panel PNL and partially overlaps the area A1. That is, the sealant SE intersects the folding lines FL1, FL2, FL3, FL4, FL5, FL6, FL7 and FL8 twice. The wiring line WL1 extends from the gate driver GD1 toward the mounting portion MT1 and intersects the folding lines FL6, FL2, FL1 and FL5. The wiring line WL2 extends from the gate driver GD2 toward the mounting portion MT1 and intersects the folding lines FL8, FL4, FL1 and FL5. The wiring lines L3 do not intersect any folding lines.

The area A2 has edges E2d and E2e in addition to the edges E2a, E2b and E2c. The edge E2d is located on an extended line of the edge E2b and is located between the folding line FL1 and the folding line FL5. The edge E2e is located on an extended line of the edge E2c and is located between the folding line FL1 and the folding line FL5.

The area A3 has edges E3d and E3e in addition to the edges E3a, E3b and E3c. The edge E3d is located on an extended line of the edge E3b and is located between the folding line FL2 and the folding line FL6. The edge E3e is located on an extended line of the edge E3c and is located between the folding line FL2 and the folding line FL6.

Since the structures of the areas A4 and A5 are the same as the structures of the areas A2 and A3, detailed description thereof will be omitted.

FIG. 6 is a perspective view in a case where the display panel PNL shown in FIG. 5 is folded along folding lines. FIG. 6 (a) shows the display surface side, and FIG. 6 (b) shows the opposite side to the display surface.

As shown in FIGS. 6 (a) and 6 (b), the display panel PNL is folded downward along the folding lines FL5, FL6, FL7 and FL8. Therefore, parts of the areas A2, A3, A4 and A5 which include the edges E2a, E3a, E4a and E5a are located on the back surface side of the area A1 and are opposed to the area A1. For example, the source driver SD and the gate drivers GD1 and GD2 are located on the same plane which is substantially parallel to the area A1. In the example illustrated, the wiring substrate PC1 is mounted on the mounting portion MT1. The wiring substrate PC1 is opposed to the area A1.

In a state where the display panel PNL is folded, the areas A2, A3, A4 and A5 do not overlap each other. That is, the edges E2a, E3a, E4a and E5a are separated from each other. In the example illustrated, the edge E2e and the edge E3d are separated from each other and extend in intersecting directions. The edge E2c and the edge E3b are separated from each other and extend substantially parallel to each other.

FIG. 7 is a sectional view taken along line A-B of FIG. 6. FIG. 7 shows a plane parallel to an X-Z plane which is defined by the first direction X and the third direction Z.

In the example illustrated, the area A3 is folded at about 90 degrees with respect to the area A1 along the folding line FL2. Further, the area A3 is folded at about 90 degrees along the folding line FL6. Still further, the area A5 is folded at about 90 degrees with respect to the area A1 along the folding line FL4. Still further, the area A5 is folded at about 90 degrees along the folding line FL8. Accordingly, the edges E3a and E5a are located directly below the area A1. Further, the gate driver GD1 located between the folding line FL6 and the edge E3a and the gate driver GD2 located between the folding line FL8 and the edge E5a are located directly below the area A1. Although not shown in the drawing, the areas A2 and A4 are folded, similarly. Note that the fold angles along the folding lines may be other than 90 degrees. Further, the fold angles along the folding lines may be different from each other.

In the example illustrated, a structural object OB is arranged in a space surrounded by the areas A1, A3 and A5. The structural object OB may be, for example, an illumination device or may be a supporter which supports the display panel PNL.

The same effect as that produced from the example shown in FIG. 2 can be produced from the first modification. Further, according to the first modification, the source driver SD and the gate drivers GD1 and GD2 can be arranged directly below the area A1. Therefore, the thickness of the display device DSP can be reduced.

(Second Modification)

Figure 8:
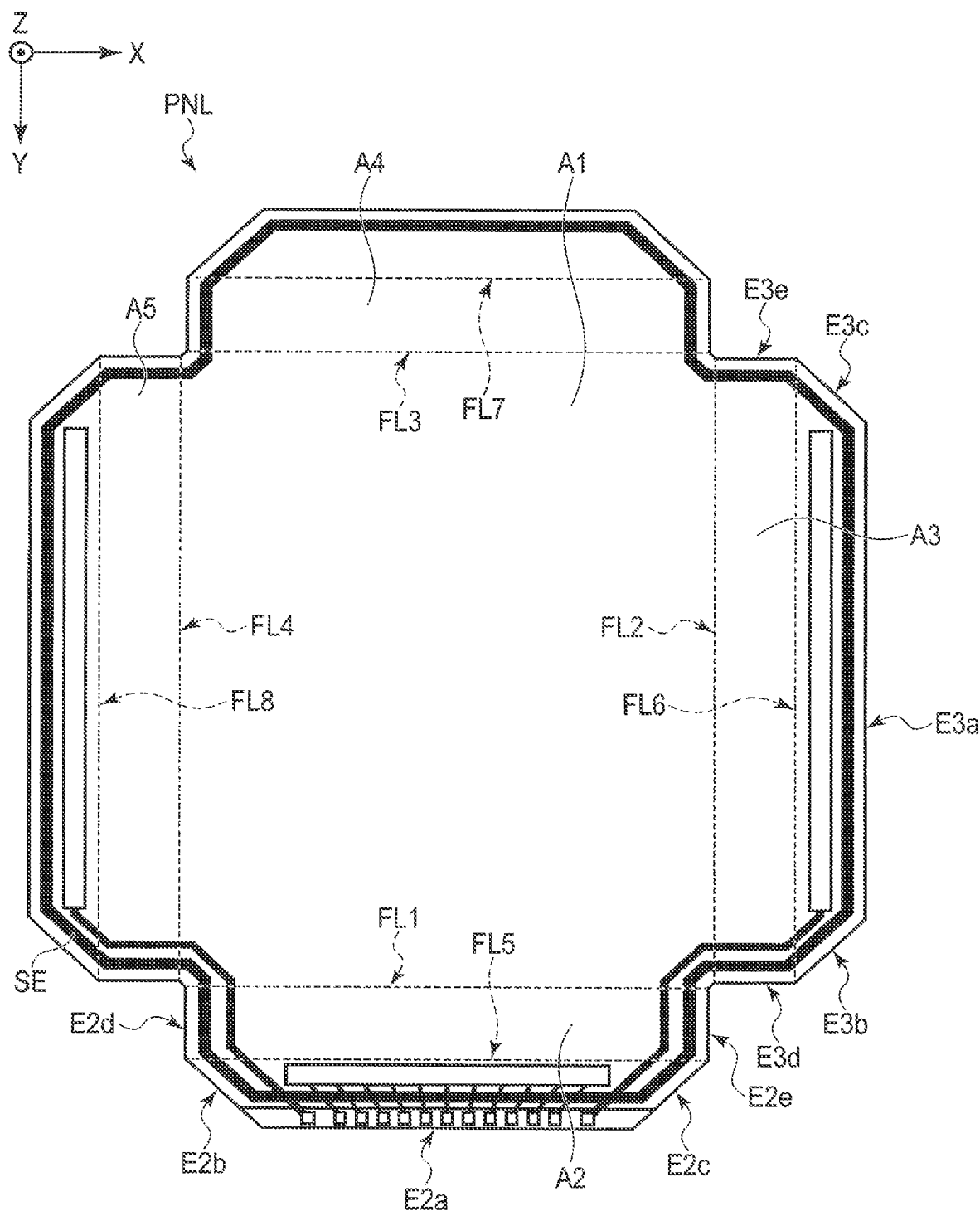
FIG. 8 is a development view showing the second modification of the display panel PNL.

FIG. 8 is a development view showing the second modification of the display panel PNL. The second modification differs from the first modification in that the edges E2d and E2e extend in the second direction Y and the edges E3d and E3e extend in the first direction X.

In the example illustrated, the edge E2d is located on an extended line of the folding line FL4 in the area A2. The edge E2e is located on an extended line of the folding line FL2. The edge E3d is located on an extended line of the folding line FL1 in the area A3. The edge E3e is located on an extended line of the folding line FL3.

The length of the edges E2d and E2e in the second direction Y and the length of the edges E3d and E3e in the first direction X are substantially equal to each other. Further, the folding lines FL1, FL3, FL5 and FL7 have substantially equal lengths. The folding lines FL2, FL4, FL6 and FL8 have substantially equal lengths.

Figure 9:
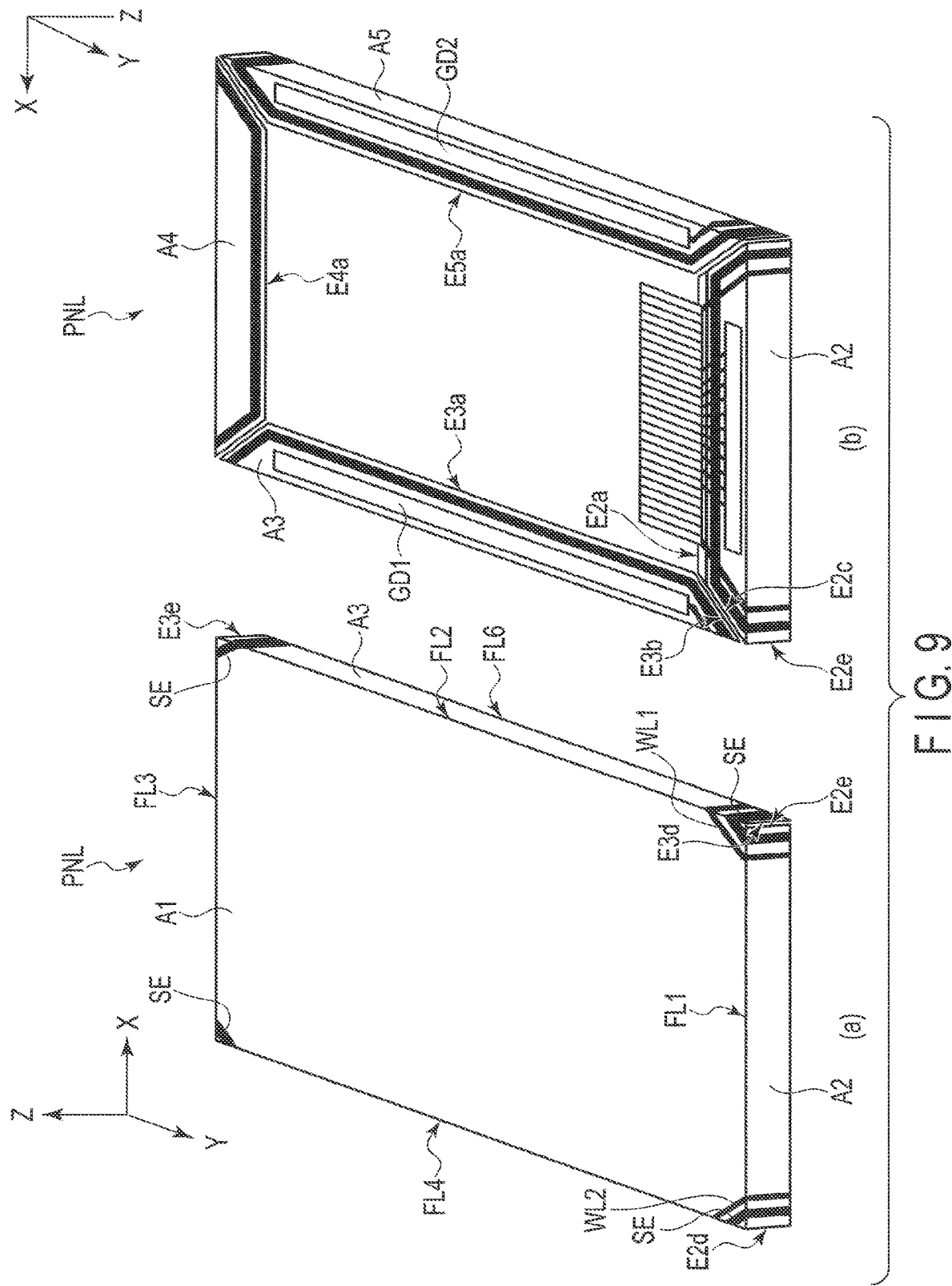
FIG. 9 is a perspective view in a case where the display panel PNL shown in FIG. 8 is folded.

FIG. 9 is a perspective view in a case where the display panel PNL shown in FIG. 8 is folded. FIG. 9 (a) shows the display surface side, and FIG. 9 (b) shows the opposite side to the display surface.

As shown in FIG. 9 (a), the edge E2e and the edge E3d are adjacent to each other and are opposed substantially parallel to each other in a state where the display panel PNL is folded. In the example illustrated, the edge E2e and the edge E3d extend in the third direction Z. Further, as shown in FIG. 9 (b), the edge E2c and the edge E3b are adjacent to each other and are opposed substantially parallel to each other. In the example illustrated, the edge E2c and the edge E3b are located on the same plane which is parallel to the X-Y plane.

In the example shown in FIG. 9 (b), the areas A2, A3, A4 and A5 are close to each other as compared to the example shown in FIG. 6 (b). The areas A2, A3, A4 and A5 do not overlap each other in FIG. 9 (b) but may overlap each other. The same effect as that produced from the first modification can be produced from the second modification.

(Third Modification)

Figure 10:
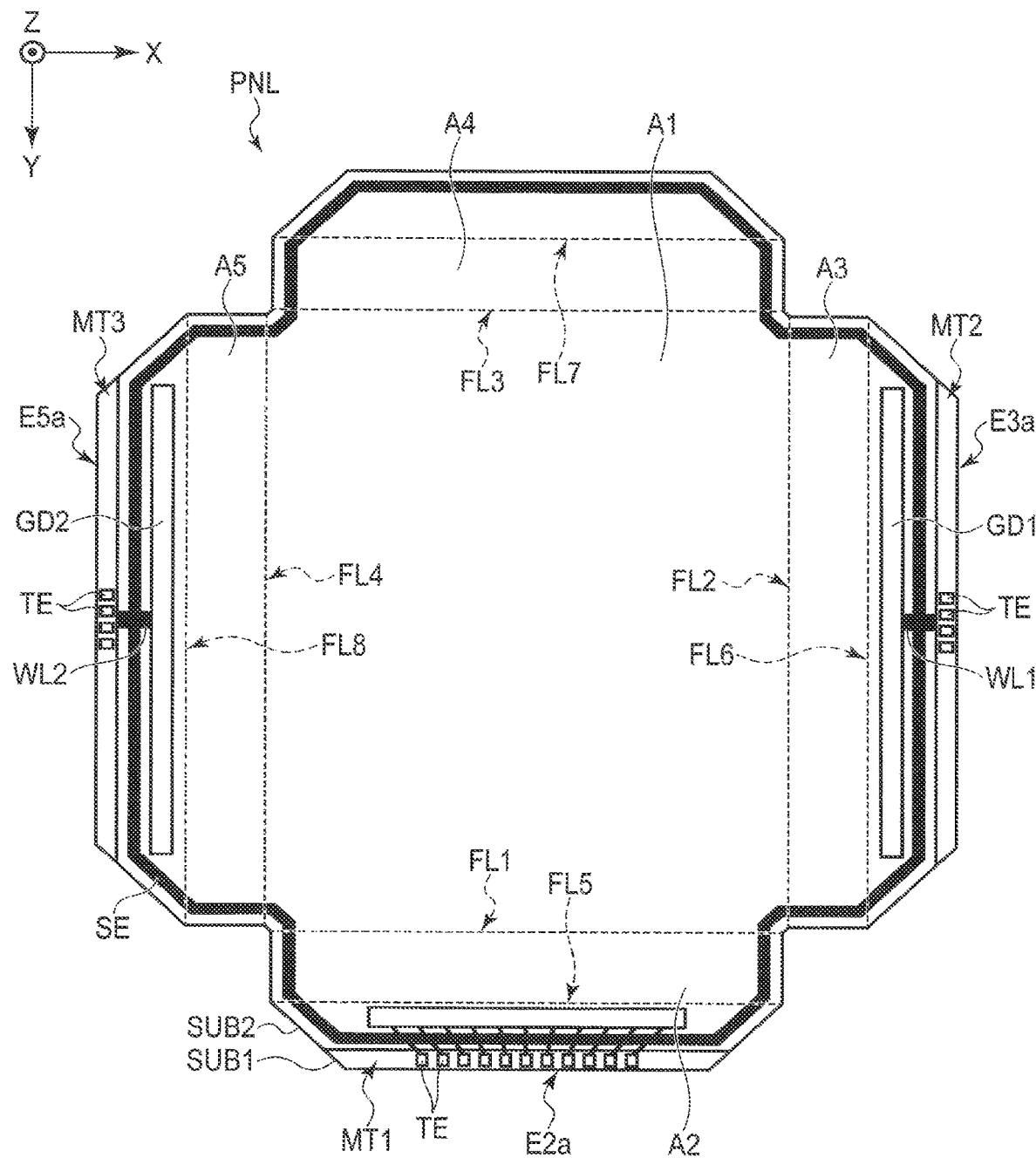
FIG. 10 is a development view showing the third modification of the display panel PNL.

FIG. 10 is a development view showing the third modification of the display panel PNL. The third modification differs from the second modification in that the display panel PNL has mounting portions MT2 and MT3 in addition to the mounting portion MT1. Similarly to the mounting portion MT1, the mounting portions MT2 and MT3 include a plurality of terminals TE, respectively.

The mounting portion MT2 is located in the area A3. The mounting portion MT2 corresponds to an area of the first substrate SUB1 which extends beyond the second substrate SUB2 in the first direction X. In the example illustrated, the mounting portion MT2 is provided along the edge E3a. The wiring line WL1 connected to the gate driver GD1 extends toward the edge E3a. That is, the wiring line WL1 is connected to the terminals TE provided in the mounting portion MT2 without intersecting the folding lines FL2 and FL6.

The mounting portion MT3 is located in the area A5. The mounting portion MT3 corresponds to an area of the first substrate SUB1 which extends beyond the second substrate SUB2 in the first direction X. In the example illustrated, the mounting portion MT3 is provided along the edge E5a. The wiring line WL2 connected to the gate driver GD2 extends toward the edge E5a. That is, the wiring line WL2 is connected to the terminals TE provided in the mounting portion MT3 without intersecting the folding lines FL4 and FL8.

Figure 11:
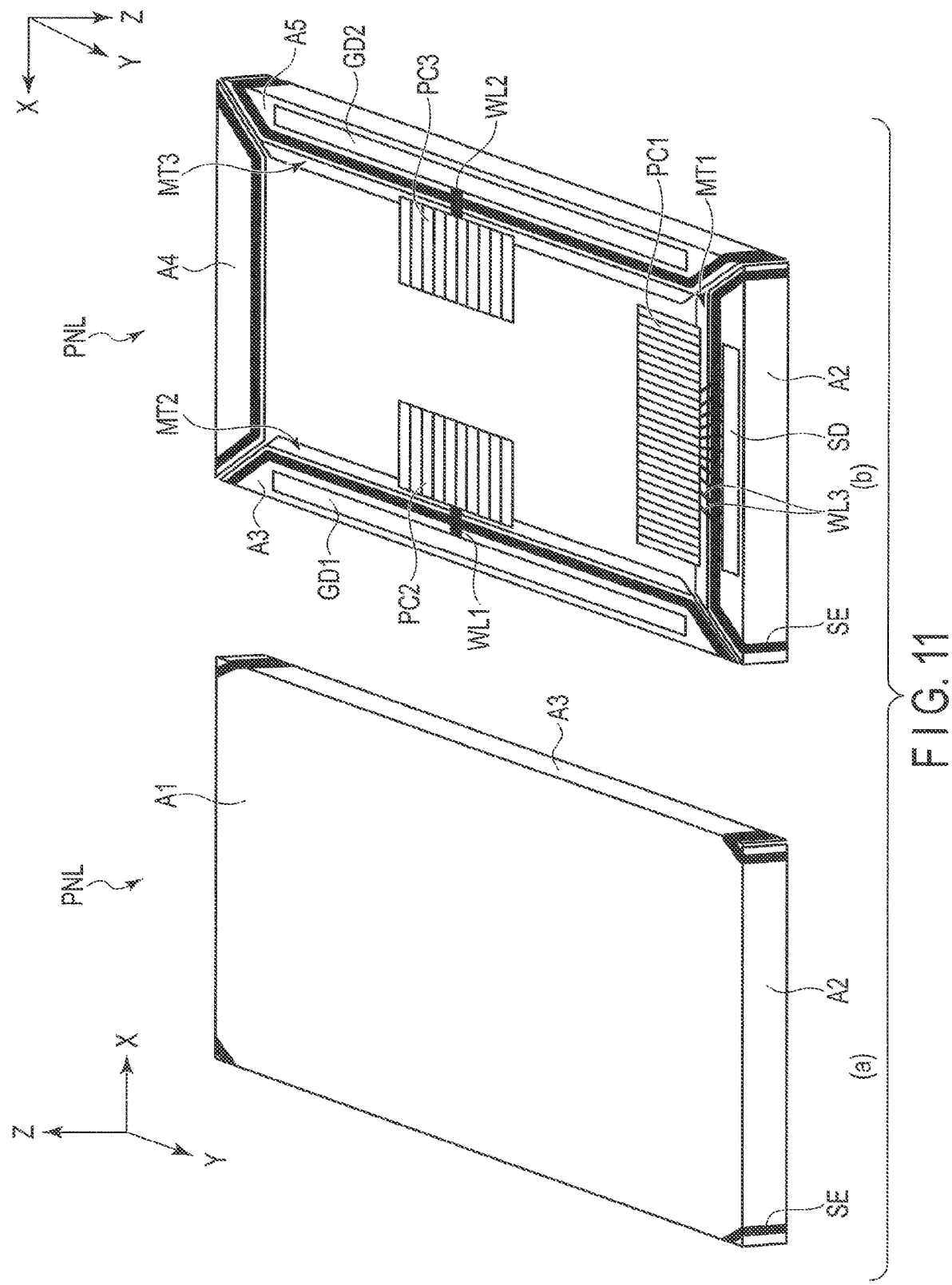
FIG. 11 is a perspective view in a case where the display panel PNL shown in FIG. 10 is folded.

FIG. 11 is a perspective view in a case where the display panel PNL shown in FIG. 10 is folded. FIG. 11 (a) shows the display surface side, and FIG. 11 (b) shows the opposite side to the display surface.

As shown in FIG. 11 (a), the wiring lines WL1 and WL2 are not arranged on the display surface side. In the example illustrated, the sealant SE is located on the display surface side.

As shown in FIG. 11 (b), the wiring substrate PC1 is mounted on the mounting portion MT1, a wiring substrate PC2 is mounted on the mounting portion MT2 and a wiring substrate PC3 is mounted on the mounting portion MT3. Similarly to the wiring substrate PC1, the wiring substrates PC2 and PC3 are flexible substrates. If wiring substrates are to be mounted after the display panel PNL is folded, one wiring substrate may be mounted on the mounting portions MT1, MT2 and MT3.

According to the third modification, the wiring lines WL1 and WL2 can be connected to an external device without passing through the area A1. Therefore, it is possible to prevent reduction of the area contributing to display and further narrow the frame.

(Fourth Modification)

FIG. 12 is a development view showing the fourth modification of the display panel PNL. The fourth modification differs from the second modification in that the areas A2, A3, A4 and A5 have reserve display areas B2, B3, B4 and B5, respectively.

Similarly to the area A1, the reserve display areas B2, B3, B4 and B5 have a plurality of pixels PX, respectively. In the reserve display areas B2, B3, B4 and B5, the pixels PX are arranged in the first direction X and the second direction Y. In the example illustrated, the reserve display areas B2, B3, B4 and B5 are rectangles. The folding line FL1 is located between the area A1 and the reserve display area B2. The folding line FL2 is located between the area A1 and the reserve display area B3. The folding line FL3 is located between the area A1 and the reserve display area B4. The folding line FL4 is located between the area A1 and the reserve display area B5. In other words, the folding lines FL1, FL2, FL3 and FL4 can be assumed to be located within the display area.

In the example illustrated, the reserve display area B2 is located between the folding line FL1 and the folding line FL5 and is closer to the folding line FL1 than to the folding line FL5. The reserve display area B3 is located between the folding line FL2 and the folding line FL6 and is closer to the folding line FL2 than to the folding line FL6. The reserve display area B4 is located between the folding line FL3 and the folding line FL7 and is closer to the folding line FL3 than to the folding line FL7. The reserve display area B5 is located between the folding line FL4 and the folding line FL8 and is closer to the folding line FL4 than to the folding line FL8. In the reserve display areas B2, B3, B4 and B5, the pixels PX may be arranged close to the folding lines FL5, FL6, FL7 and FL8 as is the case with the pixels PX arranged on the folding lines FL1, FL2, FL3 and FL4 sides.

The same effect as that produced from the second modification can be produced from the fifth modification. Further, as the pixels PX are arranged in the areas A2, A3, A4 and A5, the range of the display area can be adjusted in accordance with the accuracy of alignment of the folding lines FL1, FL2, FL3 and FL4.

(Fifth Modification)

Figure 13:
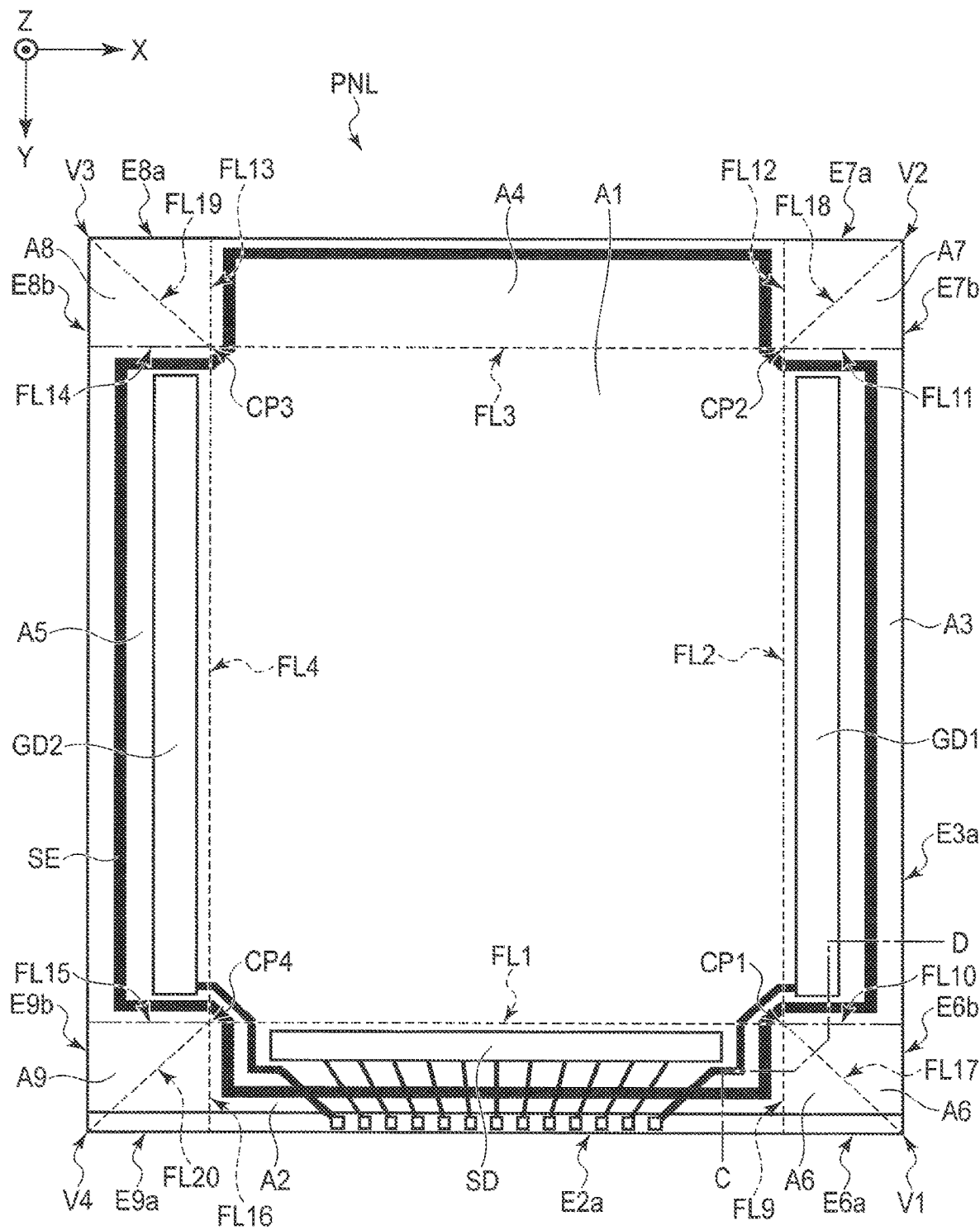
FIG. 13 is a development view showing the fifth modification of the display panel PNL.

FIG. 13 is a development view showing the fifth modification of the display panel PNL. The fifth modification differs from the example shown in FIG. 2 in that the display panel PNL has the shape of a rectangle.

The display panel PNL is a rectangle, for example. The display panel PNL has areas A6, A7, A8 and A9 in addition to the areas A1 to A5. The area A2 and the area A4 have the same shape, and the area A3 and the area A5 have the same shape. In the example illustrated, the area A2 and the area A4 have the shape of a rectangle in which sides extending in the first direction X are longer than sides extending in the second direction Y. The area A3 and the area A5 have the shape of a rectangle in which sides extending in the first direction X are shorter than sides extending in the second direction Y.

The areas A6, A7, A8 and A9 are squares having the same area. The area A6 is adjacent to the area A2 and the area A3. The area A7 is adjacent to the area A3 and the area A4. The area A8 is adjacent to the area A4 and the area A5. The area A9 is adjacent to the area A5 and the area A2.

The display panel PNL has folding lines FL9, FL10, FL11, FL12, FL13, FL14, FL15 and FL16 in addition to the folding lines FL1, FL2, FL3 and FL4. The folding line FL9 is located at the border between the area A6 and the area A2. The folding line FL10 is located at the border between the area A6 and the area A3. The folding line FL11 is located at the border between the area A7 and the area A3. The folding line FL12 is located at the border between the area A7 and the area A4. The folding line FL13 is located at the border between the area A8 and the area A4. The folding line FL14 is located at the border between the area A8 and the area A5. The folding line FL15 is located at the border between the area A9 and the area A5. The folding line FL16 is located at the border between the area A9 and the area A2.

In the example illustrated, the folding lines FL10 and FL15 are located on extended lines of the folding line FL1. The folding lines FL9 and FL12 are located on extended lines of the folding line FL2. The folding lines FL11 and FL14 are located on extended lines of the folding line FL3. The folding lines FL13 and FL16 are located on extended lines of the folding line FL4. For example, the folding lines FL9, FL12, FL13 and FL16 are downward folding lines, and FL10, FL11, FL14 and FL15 are upward folding lines.

Further, the display panel PNL has folding lines FL17, FL18, FL19 and FL20 in the areas A6, A7, A8 and A9. The folding line FL17 linearly extends from an intersection CP1 of the folding lines FL1 and FL2 toward a vertex V1 of the display panel PNL. The folding line FL18 linearly extends from an intersection CP2 of the folding lines FL2 and FL3 toward a vertex V2 of the display panel PNL. The folding line FL19 linearly extends from an intersection CP3 of the folding lines FL3 and FL4 toward a vertex V3 of the display panel PNL. The folding line FL20 linearly extends from an intersection CP4 of the folding lines FL4 and FL1 toward a vertex V4 of the display panel PNL. All the folding lines FL17, FL18, FL19 and FL20 are downward folding lines.

Here, the vertex V1 corresponds to the intersection of an edge E6a of the area A6 extending in the first direction X and an edge E6b of the area A6 extending in the second direction Y. Similarly, the vertex V2 corresponds to the intersection of an edge E7a of the area A7 extending in the first direction X and an edge E7b of the area A7 extending in the second direction Y. The vertex V3 corresponds to the intersection of an edge E8a of the area A8 extending in the first direction X and an edge E8b of the area A8 extending in the second direction Y. The vertex V4 corresponds to the intersection of an edge E9a of the area A9 extending in the first direction X and an edge E9b of the area A9 extending in the second direction Y.

The sealant SE is not arranged in the areas A6, A7, A8 and A9. More specifically, the sealant SE is located in the areas A2, A3, A4 and A5, and passes on the inner sides of the intersections CP1, CP2, CP3 and CP4 and is arranged in the area A1. In other words, the sealant SE intersects the folding lines FL1, FL2, FL3 and FL4 twice.

Further, the wiring lines WL1 and WL2 are not arranged in the areas A6 and A9, similarly to the sealant SE. In the example illustrated, the wiring lines WL1 and WL2 extend along the sealant SE and are located on the inner side from the sealant SE. That is, the wiring line WL1 extends from the area A3 to the area A2 through the area A1. The wiring line WL2 extends from the area A5 to the area A2 through the area A1. The wiring line WL1 intersects the folding lines FL2 and FL1, and the wiring line WL2 intersects the folding lines FL4 and FL2.

Figure 14:
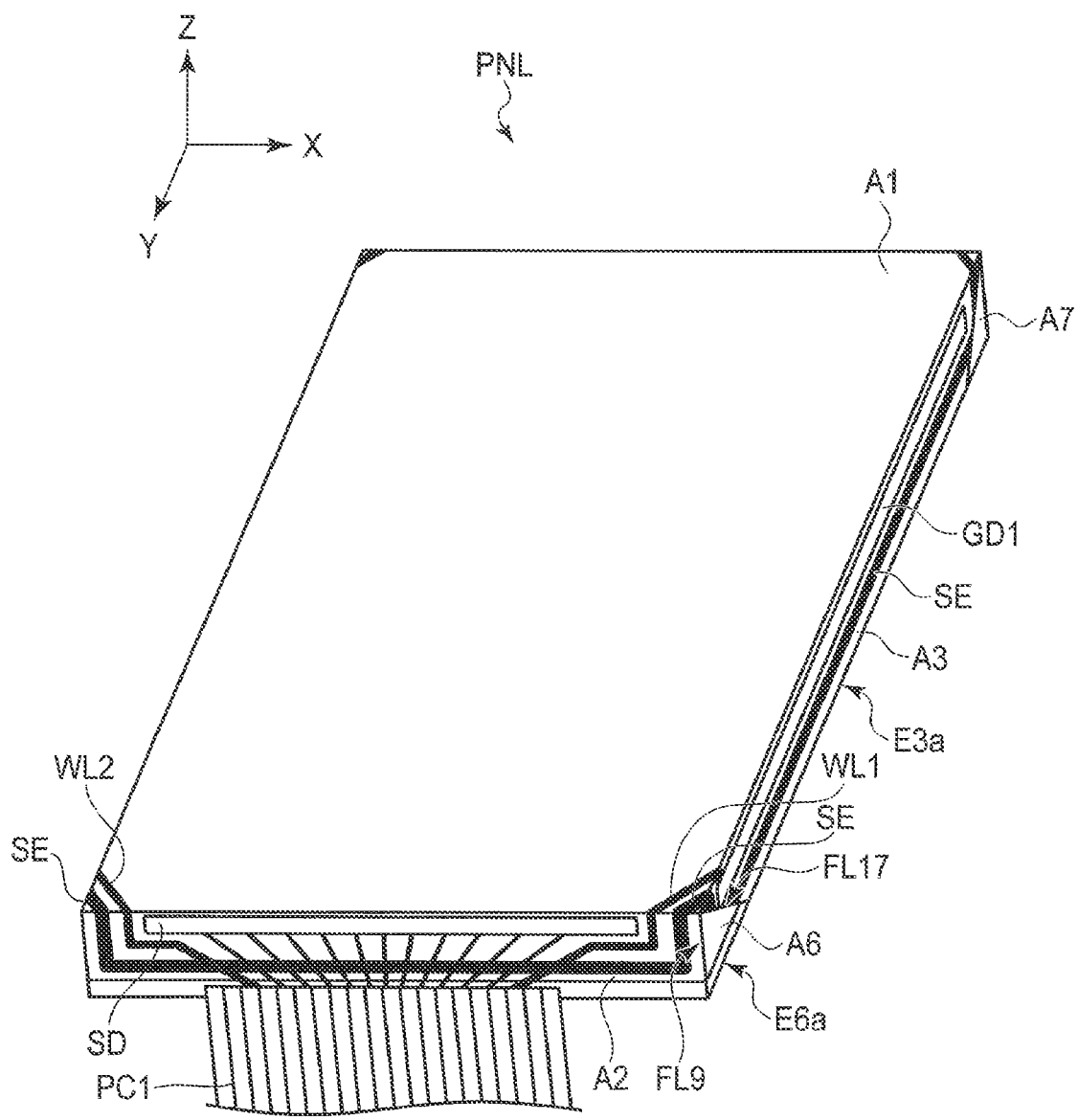
FIG. 14 is a perspective view in a case where the display panel PNL shown in FIG. 13 is folded.

FIG. 14 is a perspective view in a case where the display panel shown in FIG. 13 is folded. Here, the vicinity of the area A6 will be described. Since the same also applies to the vicinities of the areas A7, A8 and A9, detailed description thereof will be omitted.

The folding line FL9 extends in the third direction Z. The folding line FL9 overlaps the folding line FL10 shown in FIG. 13. The area A6 is folded in an area having the shape of a right triangle defined by the folding line FL9, the folding line FL17 and the edge E6a. In the example illustrated, the area A6 is arranged along the area A3. The edge E6a overlaps the edge E3a. In the example illustrated, the gate driver GD1 and the sealant SE in the area A3 partially overlap the area A6. The area A6 may be arranged along the area A2 instead. In that case, the folding line FL9 shown in FTG. 13 is an upward folding line, and the folding line FL10 shown in FIG. 13 is a downward folding line.

Figure 15:
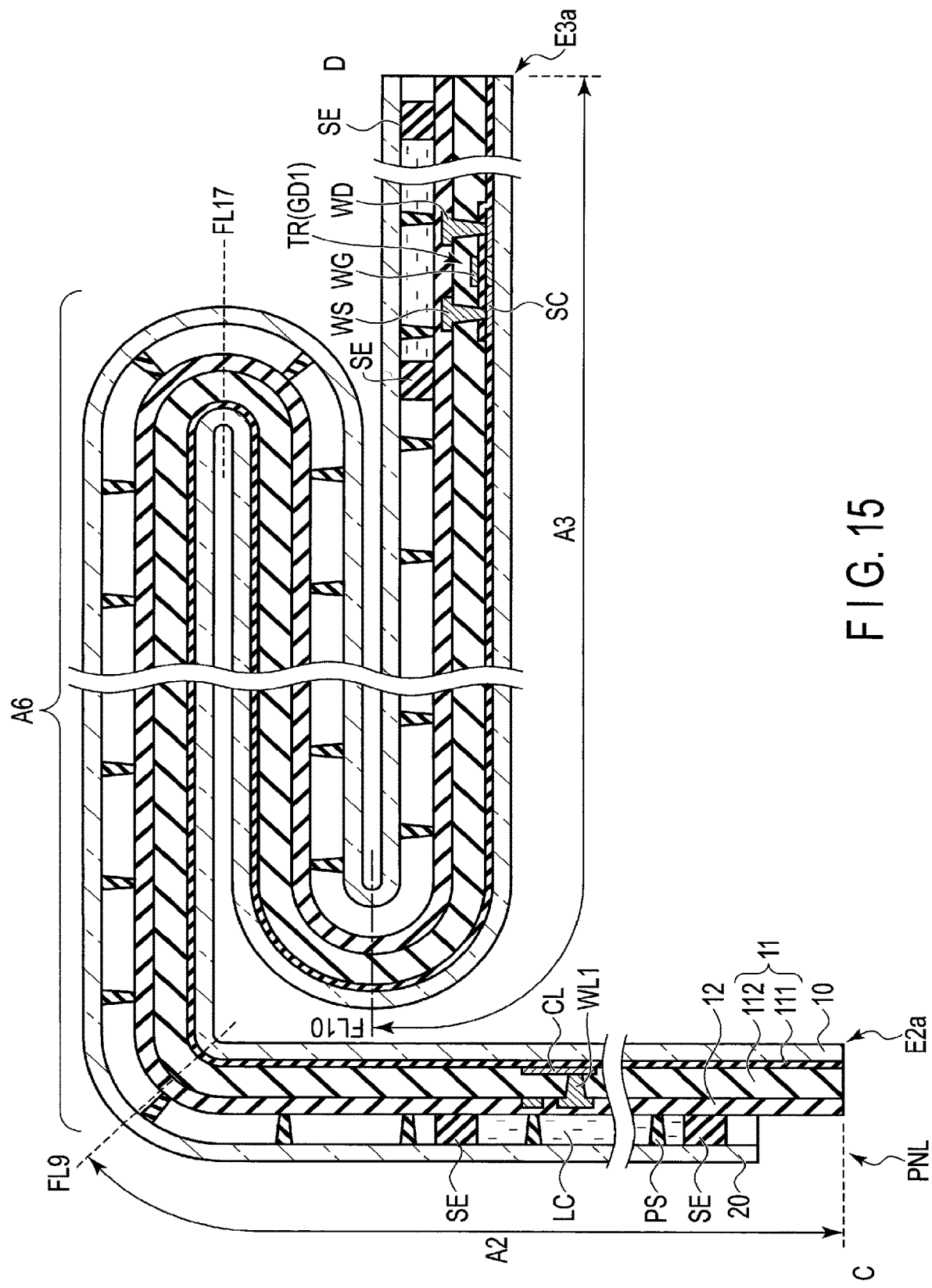
FIG. 15 is a schematic sectional view taken along line C-D of FIG. 13.

FIG. 15 is a schematic sectional view taken along line C-D of FIG. 13. Here, only elements necessary for explanation are illustrated, and some elements such as insulating layers are omitted.

The display panel PNL includes the basement 10, the basement 20, an insulating layer 111, an insulating layer 112, the insulating layer 12, the sealant SE, the liquid crystal layer LC and a spacer PS. The insulating layers 111 and the insulating layer 112 correspond to the insulating layer 11 shown in FIG. 3.

The display panel PNL includes a thin-film transistor TR which constitutes the gate driver GD1. The thin-film transistor TR includes a semiconductor layer SC, a gate electrode WG, a source electrode WS and a drain electrode WD. In the example illustrated, the semiconductor layer SC is formed on the basement 10 and is covered with the insulating layer 111. The gate electrode WG is formed on the insulating layer 111 and is covered with the insulating layer 112. The source electrode WS and the drain electrode WD are formed on the insulating layer 112 and are covered with the insulating layer 12. The source electrode WS and the drain electrode WD contact the semiconductor layer SC in contact holes provided in the insulating layer 112.

The display panel PNL includes the wiring line WL1 in the area A2. The wiring line WL1 is electrically connected to the gate driver GD1. For example, the wiring line WL1 is formed in the same layer as that of the source electrode WS and the drain electrode WD of the thin-film transistor TR. That is, the wiring line WL1 is formed on the insulating layer 112 and is covered with the insulating layer 12. In the example illustrated, the wiring line WL1 is electrically connected to a conductive layer CL located directly below. The conductive layer CL is formed in the same layer as that of the gate electrode WG. That is, the conductive layer CL is formed on the insulating layer 111 and is covered with the insulating layer 112. The wiring line WL1 contacts the conductive layer CL in a contact hole formed in the insulating layer 112.

In the example illustrated, the liquid crystal layer LC is located between the sealant SE and the sealant SE in the areas A2 and A3. The liquid crystal layer LC is not located in the area A6.

The display panel PNL structured as described above is folded at about 90 degrees downward along the folding line FL9. The display panel PNL is folded at about 180 degrees downward along the folding line FL17. The display panel PNL is folded at about 180 degrees upward along the folding line FL10.

As described above, the sealant SE, the liquid crystal layer LC, the wiring line WL1 and the gate driver GD1 are not provided in the area A6. In other words, the sealant SE, the liquid crystal layer LC, the wiring line WL1 and the gate driver GD1 are not located in an area in which the display panel PNL is folded at 180 degrees. On the other hand, in the example illustrated, the insulating layers 11 and 12 and the spacer PS are formed across the areas A2, the area A6 and the area A3, that is, thoroughly from the edge E2a to the edge E3a.

The same effect as that produced from the example shown in FIG. 2 can be produced from the fifth modification. Further, since the display panel PNL has the areas A6, A7, A8 and A9 which connect the area A2 and the area A3, the area A3 and the area A4, the area A4 and the area A5, and the area A5 and the area A2, respectively, the folded state of the display panel PNL can be easily maintained.

(Sixth Modification)

Figure 16:
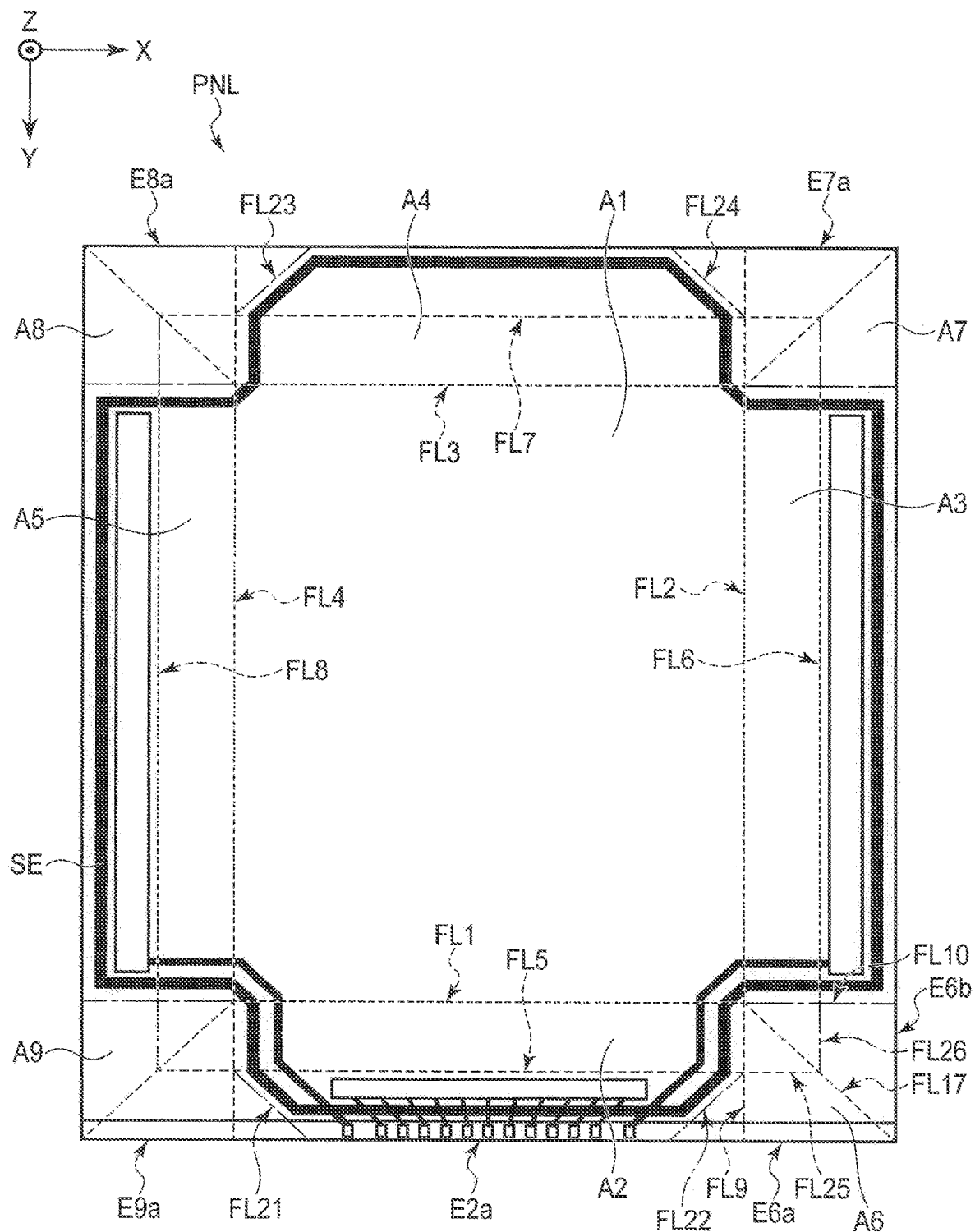
FIG. 16 is a development view showing the sixth modification of the display panel PNL.

FIG. 16 is a development view showing the sixth modification of the display panel PNL. The sixth modification differs from the fifth modification in that a plurality of folding lines are located in the areas A2 to A9, respectively.

Similarly to the first modification, the areas A2, A3, A4 and A5 have the folding lines FL5, FL6, FL7 and FL8.

Further, the area A2 has folding lines FL21 and FL22 in addition to the folding line FL5. The folding line FL21 extends from one end of the folding line FL5 toward the edge E2a. The intersection of the edge E2a and the folding line FL21 is far from the area A9 than the intersection of the folding line FL5 and the folding line FL21. The folding line FL22 extends from the other end of the folding line FL5 toward the edge E2a. The intersection of the edge E2a and the folding line FL22 is far from the area A6 than the intersection of the folding line FL5 and the folding line FL22. Both the folding lines FL21 and FL22 are upward folding lines.

The area A4 has folding lines FL23 and FL24 in addition to the folding line FL7. The folding line FL23 extends from one end of the folding line FL7 toward the edge E4a. The intersection of the edge E4a and the folding line FL23 is far from the area A8 than the intersection of the folding line FL7 and the folding line FL23. The folding line FL24 extends from the other end of the folding line FL7 toward the edge E4a. The intersection of the edge E4a and the folding line FL24 is far from the area A7 than the intersection of the folding line FL7 and the folding line FL24. Both the folding lines FL23 and FL24 are upward folding lines.

The area A6 has folding lines FL25 and FL26 in addition to the folding line FL17. The folding line FL25 is located on an extended line of the folding line FL5 between the folding line FL9 and the folding line FL17. The folding line FL26 is located on an extended line of the folding line FL6 between the folding line FL10 and the folding line FL17. The intersection of the folding line FL25 and the folding line FL26 is located on the folding line FL17. The arrangements of the folding lines in the areas A7, A8 and A9 are the same as the arrangement of the folding lines FL25 and FL26 in the area A6, and therefore detailed description thereof will be omitted. Note that the arrangements of the folding lines in the areas A7, A8 and A9 are rotated 90, 180 and 270 degrees, respectively, from the arrangement of the folding lines FL25 and FL26.

The sealant SE is located on the inner side from the folding lines FL21 and FL22 in the area A2. That is, the sealant SE only intersects the folding line FL5 in the area A2. Further, the sealant SE is located on the inner side from the folding lines FL23 and FL24 in the area A4. That is, the sealant SE only intersects the folding line FL7 in the area A4.

Figure 17:
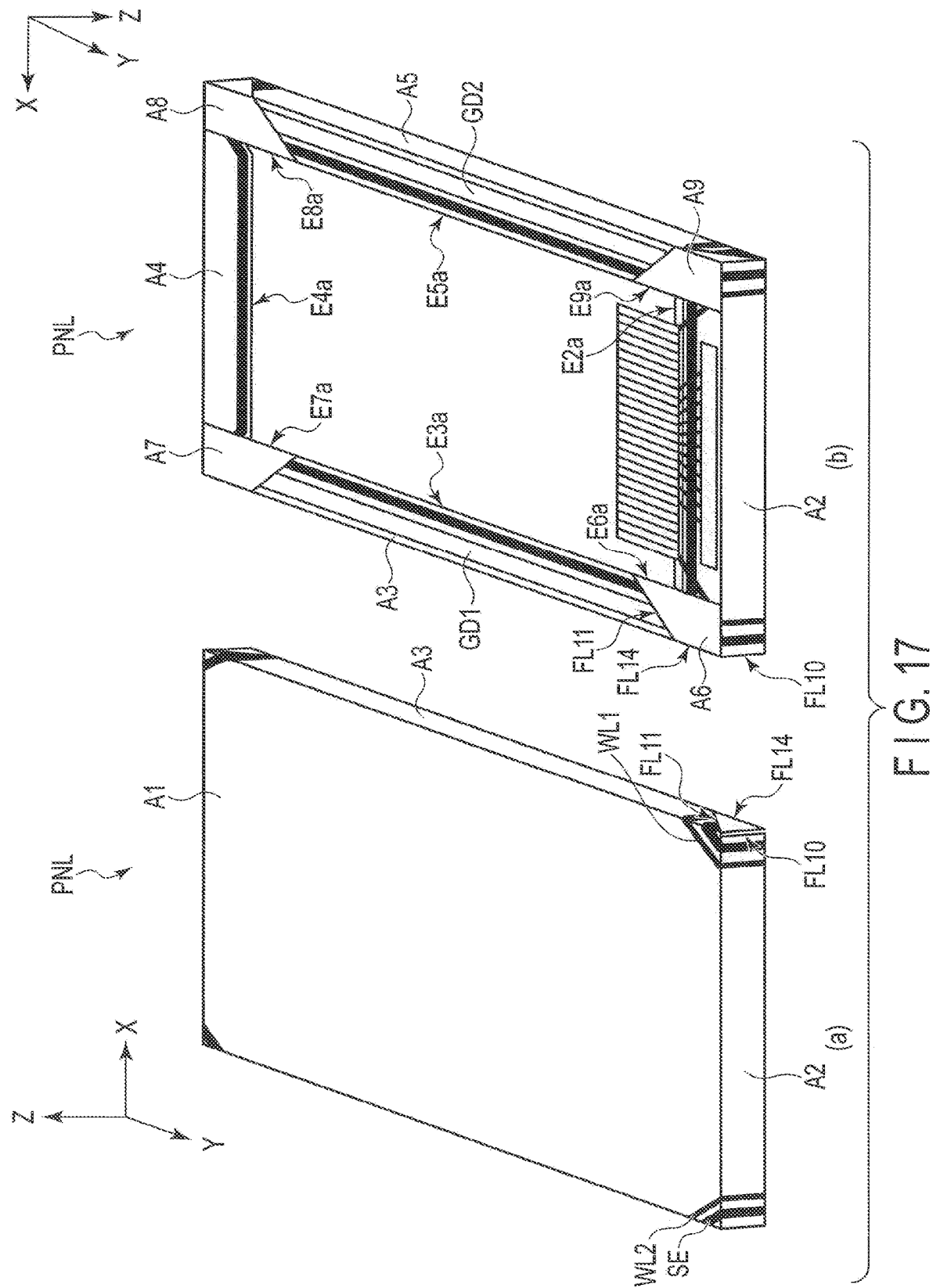
FIG. 17 is a perspective view in a case where the display panel PNL shown in FIG. 16 is folded.

FIG. 17 is a perspective view in a case where the display panel PNL shown in FIG. 16 is folded. FIG. 17 (a) shows the display surface side, and FIG. 17 (b) shows the opposite side to the display surface.

After the display panel PNL is folded as is the case with the fifth modification shown in FIG. 14, the area A2 is folded along the upward folding lines FL21 and FL22 and the area A4 is folded along the upward folding lines FL23 and FL24. Accordingly, as shown in FIG. 17 (b), parts of the areas A2, A3, A4 and A5 which include the edges E2a, E3a, E4a and E5a are opposed to the back surface side of the area A1. The source driver SD and the gate drivers GD1 and GD2 are located on the same plane which is substantially parallel to the area A1.

In the example illustrated, the area A3 overlaps the areas A2 and A4. Further, the area A5 overlaps the areas A2 and A4. That is, the edges E3a and the edge E5a overlap the areas A2 and A4.

Further, the areas A6, A7, A8 and A9 are partially opposed to the area A1. The area A6 overlaps the areas A2 and A3. The area A7 overlaps the areas A3 and A4. The area A8 overlaps the areas A4 and A5. The area A9 overlaps the areas A5 and A2. The edges E6a, E7a, E8a and E9a shown in FIG. 16 extend in the second direction Y in the example shown in FIG. 17 (b). For example, the edges E6a and E7a overlap the edge E3a. The edges E8a and E9a overlap the edge E5a. In the example illustrated, the area A6 and the area A7 overlap the gate driver GD1. The area A8 and the area A9 overlap the gate driver GD2.

The same effect as that produced from the fifth modification can be produced from the sixth modification. Further, the source driver SD and the gate drivers GD1 and GD2 are arranged directly below the area A1, and therefore the thickness of the display device DSP can be reduced.

(Seventh Modification)

Figure 18:
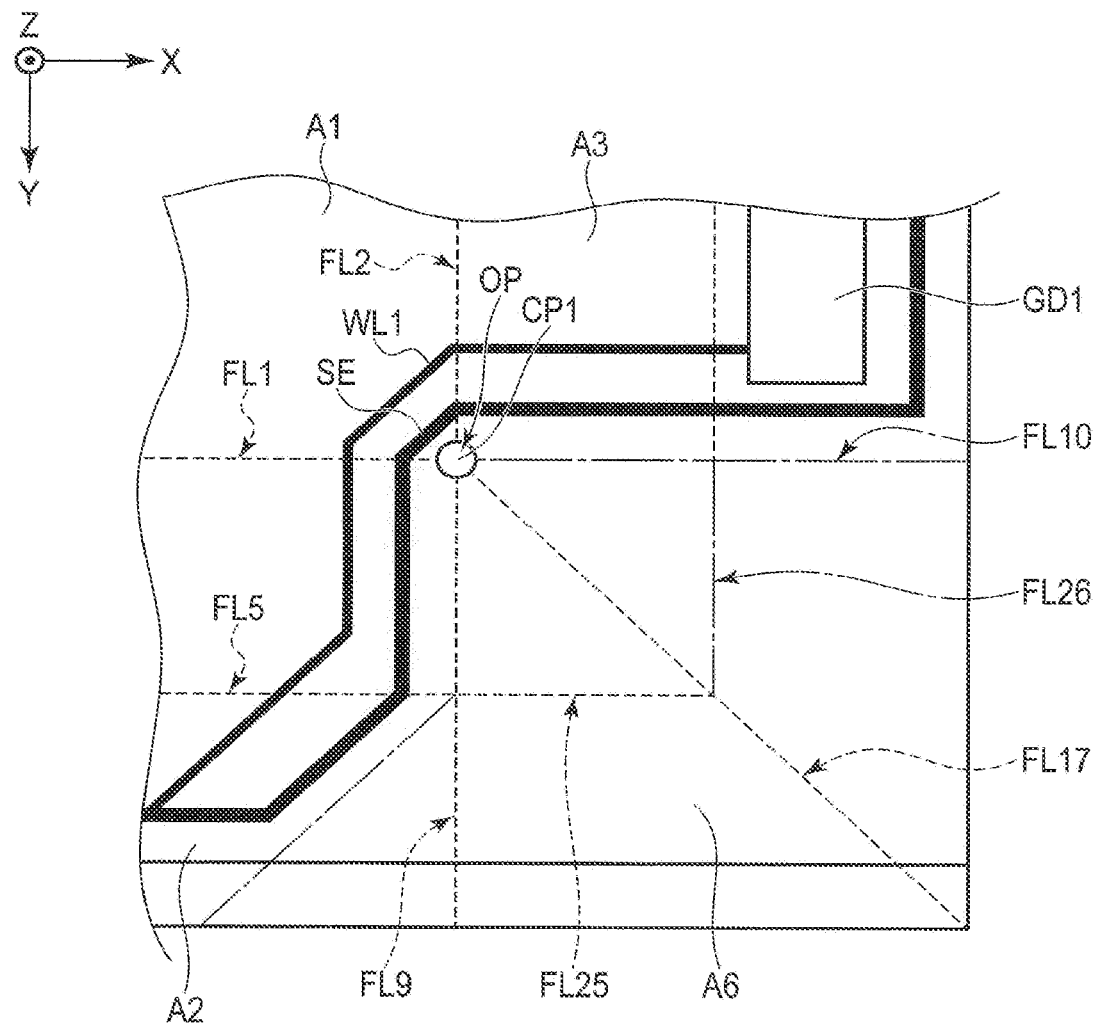
FIG. 18 is a development view showing the seventh modification of the display panel PNL.

FIG. 18 is a development view showing the seventh modification of the display panel PNL. FIG. 18 is an enlarged view of the area A6. The seventh modification differs from the sixth modification in that the display panel PNL has an opening OP.

The opening OP is provided at the intersection CP1 of the folding lines FL1 and FL2. The sealant SE is located on the inner side from the opening OP. The opening OP is formed at least in the basements 10 and 20 shown in FIG. 3. Note that the areas A7, A8 and A9 also have the same structure.

The same effect as that produced from the sixth modification can be produced from the seventh modification. Further, according to the seventh modification, as the opening OP is provided at the intersection CP1, a concentration of stress caused by folds on the intersection CP1 can be prevented. Therefore, the display panel PNL can be easily folded.

(Eighth Modification)

Figure 19:
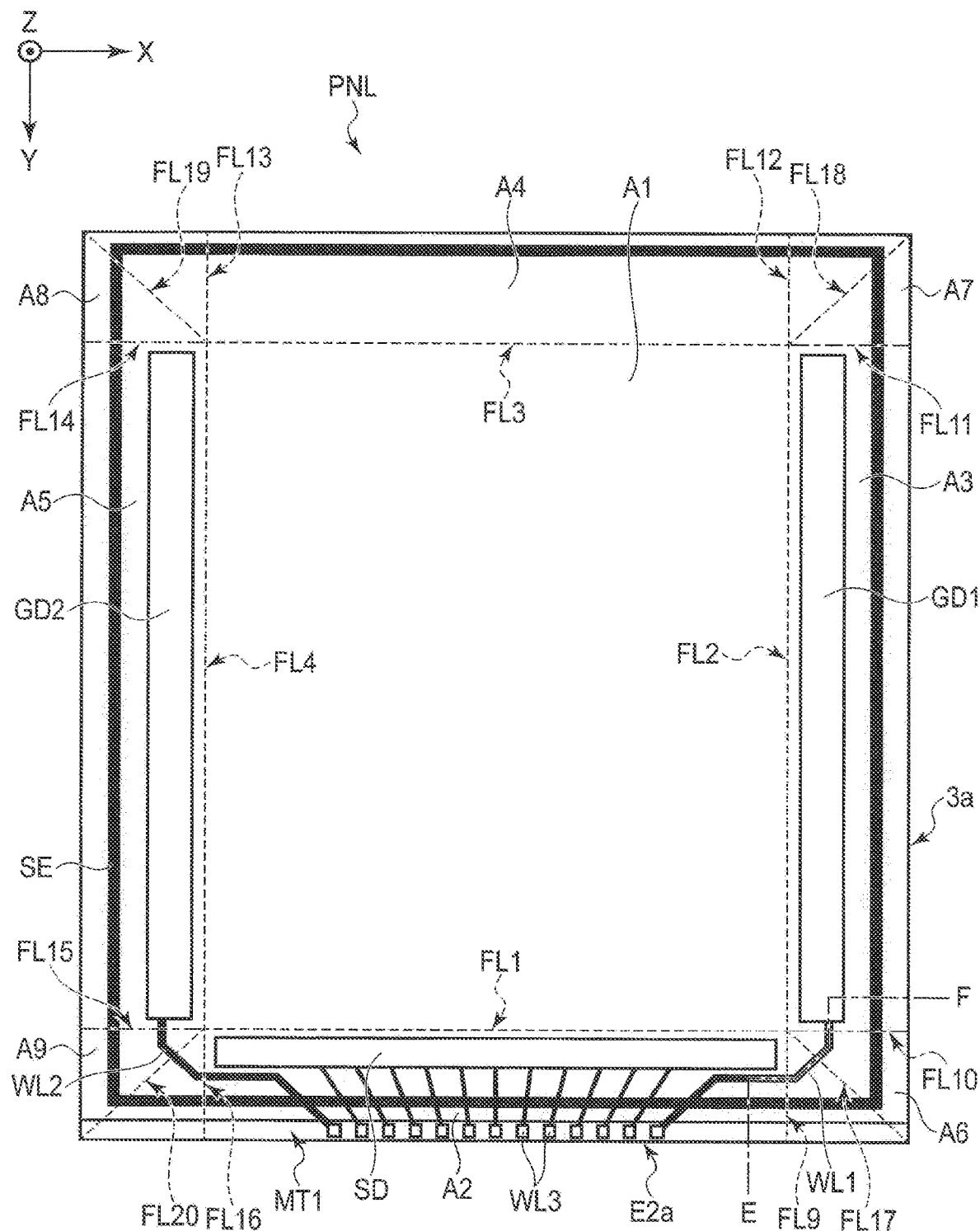
FIG. 19 is a development view showing the eighth modification of the display panel PNL.

FIG. 19 is a development view showing the eighth modification of the display panel PNL. The eighth modification differs from the fifth modification in that the sealant SE and the wiring lines WL1 and WL2 are not located in the area A1.

The sealant SE is provided in the shape of a frame across the areas A2 to A9. That is, the sealant SE does not intersect the folding lines FL1 to FL4 but intersects the folding lines FL9 to FL20. In the example illustrated, the sealant SE is provided in the shape of a substantially rectangular frame along the outer periphery of the display panel PNL.

The wiring line WL1 extends from the gate driver GD1 to the area A2 through the area A6. That is, the wiring line WL1 intersects the folding lines FL10, FL17 and FL9. The wiring line WL1 is located on the inner side from the sealant SE in the area A6. The wiring line WL2 extends from the gate driver GD2 to the area A2 through the area A9. That is, the wiring line WL2 intersects the folding lines FL15, FL20 and FL16. The wiring line WL2 is located on the inner side from the sealant SE in the area A9.

Figure 20:
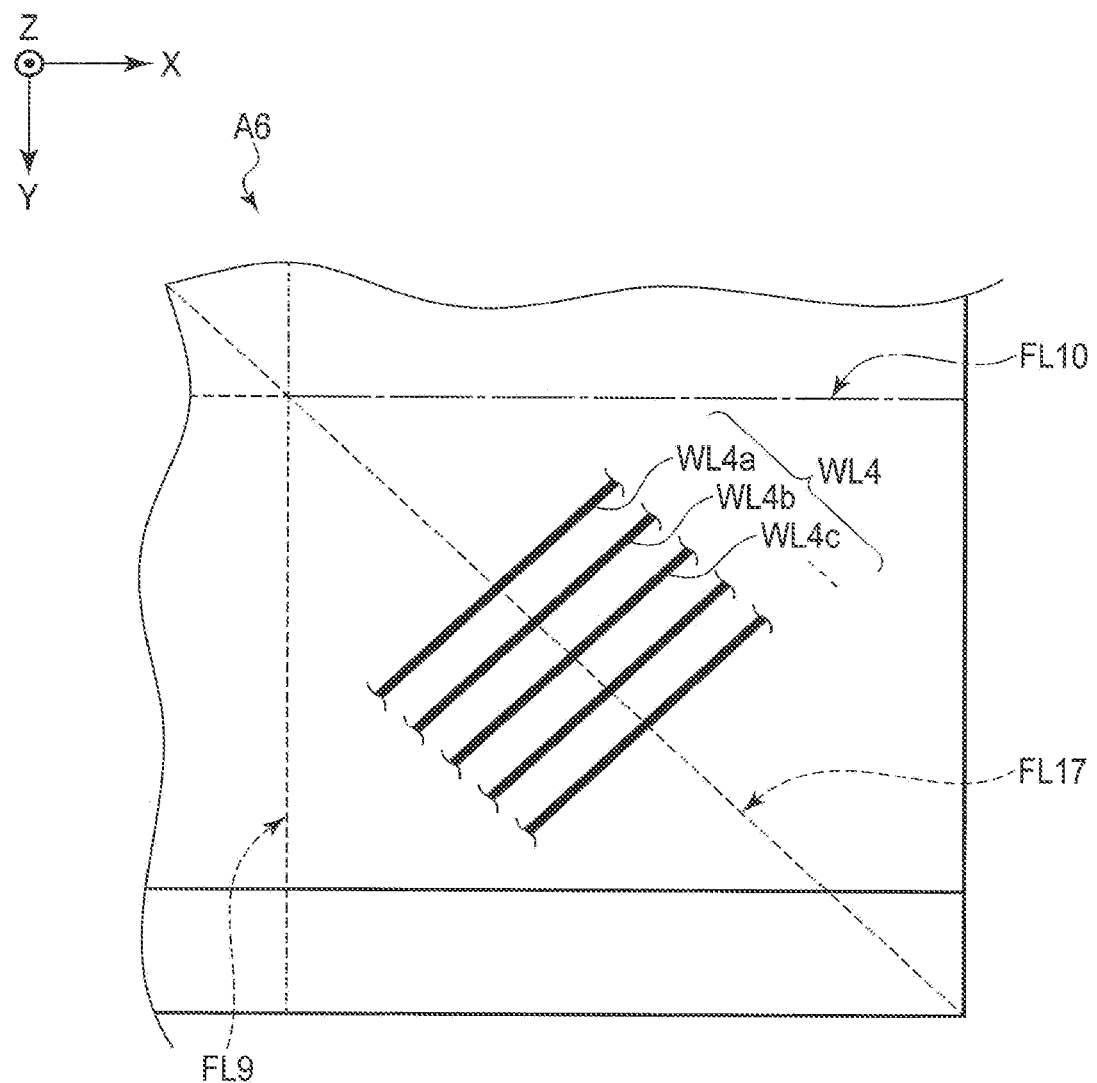
FIG. 20 is an enlarged plan view of an area A6 shown in FIG. 19.

FIG. 20 is an enlarged plan view of the area A6 shown in FIG. 19. Here, the wiring line WL1 and the sealant SE are not illustrated.

A plurality of wiring lines WL4 (WL4a, WL4b, WL4c, . . . ) are formed in the area A6. These wiring lines WL4 may supply different signals in some cases. That is, the potential of the wiring line WL4a and the potential of the wiring line WL4b may be different from each other in some cases. The wiring lines WL4 are arranged at intervals in the extension direction of the folding line FL17 in the area A6. In the example illustrated, the wiring line WL4 is arranged parallel to the adjacent wiring line WL4. In other words, the wiring line WL4a and the wiring line WL4b do not intersect each other in an area overlapping the folding line FL17. That is, a multilayer structure of the wiring line WL4a and the wiring line WL4b is not formed in an area in which the display panel PNL is folded 180 degrees.

Figure 21:
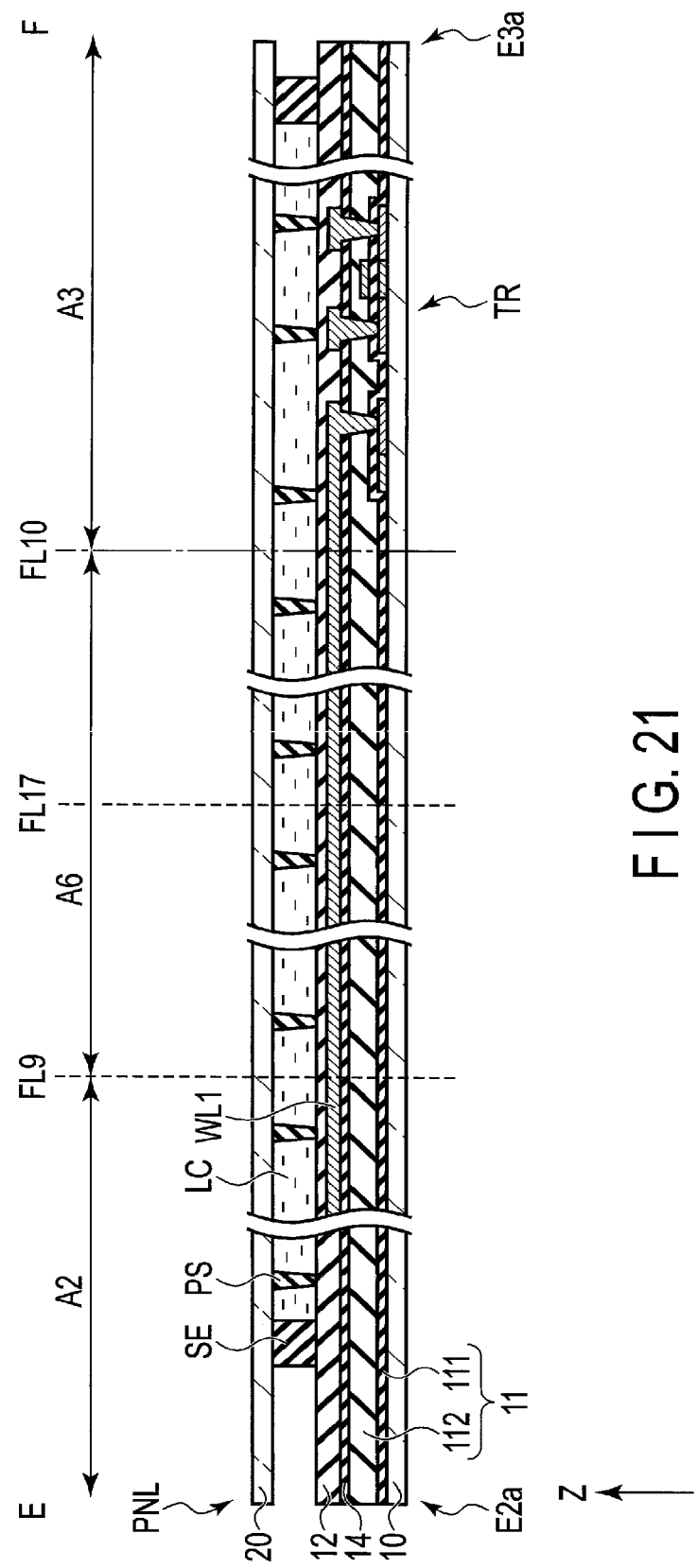
FIG. 21 is a sectional view taken along line E-F of FIG. 19.

FIG. 21 is a sectional view taken along line E-F of FIG. 19. Here, only elements necessary for explanation are illustrated, and some elements such as insulating layers are omitted.

The display panel PNL includes an insulating layer 14 in addition to the basement 10, the basement 20, the insulating layer 111, the insulating layer 112, the insulating layer 12, the sealant SE, the liquid crystal layer LC, the spacer PS and the wiring line WL1.

In the example illustrated, the insulating layer 14 is located between the insulating layer 112 and the insulating layer 12 thoroughly between the edge E2a and the edge E3a. The insulating layer 14 is formed of an organic material such as polyimide, for example. The insulating layer 14 is provided in areas overlapping at least the folding lines FL9, FL17 and FL10.

The wiring line WL1 extends from the area A3 to the area A2 through the area A6. That is, the wiring line WL1 intersects the folding lines FL10, FL17 and FL9. In the example illustrated, the wiring line WL1 is formed on the insulating layer 14 and is covered with the insulating layer 12 across the areas A3, A6 and A2. That is, the wiring line WL1 entirely contacts an organic material except an area in which a contact hole is formed.

According to the eighth modification, the wiring lines WL1 and WL2 and the sealant SE are not located in the area A1. Therefore, the frame of the display device DSP can be further narrowed. Further, the wiring line WL1 is located between the insulating layer 12 and the insulating layer 14 which are formed of organic materials. Therefore, even if the display panel PNL is folded at 180 degrees, disconnection of the wiring line WL1 can be prevented. Further, the wiring lines WL4 arranged in the area A6 do not overlap each other at least on the folding line FL17. Therefore, a concentration of stress on an area folded at 180 degrees can be moderated.

(Ninth Modification)

Figure 22:
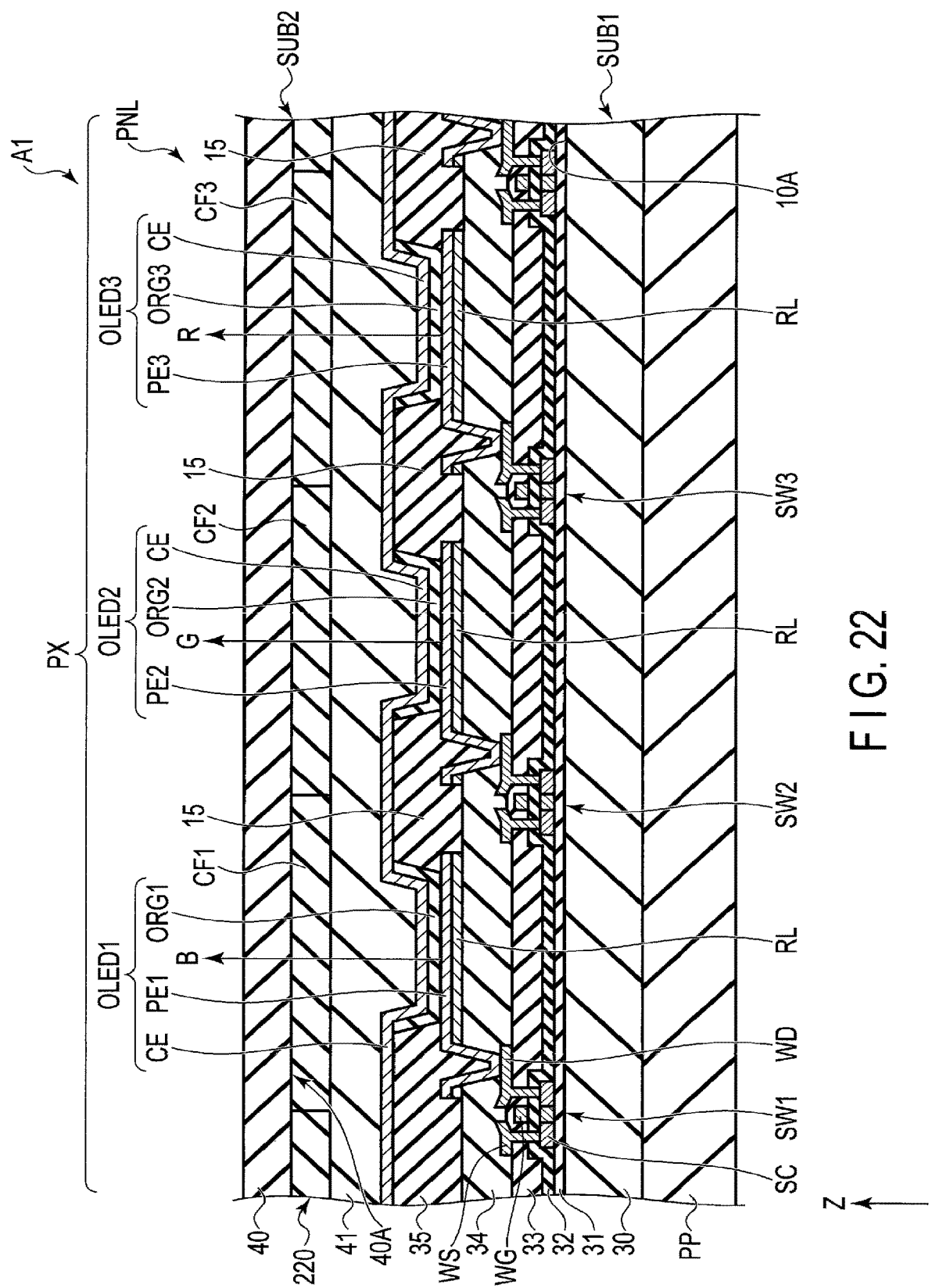
FIG. 22 is a sectional view showing the ninth modification of the display panel PNL.

FIG. 22 is a sectional view showing the ninth modification of the display panel PNL. The ninth modification differs from the example shown in FIG. 3 in that the display panel PNL includes an organic EL element as a display element.

FIG. 22 is a sectional view of the area A1 shown in FIG. 2. The display panel PNL is composed of the first substrate SUB1 and the second substrate SUB2. In the example illustrated, a protective member PP is provided below the first substrate SUB1.

The first substrate SUB1 includes a basement 30, the switching elements SW (SW1, SW2 and SW3), a reflective layer RL, organic EL elements OLED (OLED1, OLED2 and OELD3), the protective member PP, etc.

The basement 30 is formed of an organic insulating material such as polyimide, for example. An insulating layer 31 is formed on the basement 30. The insulating layer 31 may include a barrier layer which prevents entry of moisture, etc., from the basement 30 to the organic EL elements OLED. The insulating layer 31 may be omitted.

The switching elements SW are formed on the insulating layer 31. Each switching element SW is composed of a thin-film transistor (TFT), for example. The switching element SW is a top-gate transistor in the example illustrated but may be a bottom-gate transistor. As an example of the structure, the structure of the switching element SW1 will be described below.

The switching element SW1 includes the semiconductor layer SC, the gate electrode WG, the source electrode WS and the drain electrode WD.

The semiconductor layer SC is formed on the insulating layer 31 and is covered with an insulating layer 32. The gate electrode WG is formed on the insulating layer 32 and is covered with an insulating layer 33. The source electrode WS and the drain electrode WD are formed on the insulating layer 33. The source electrode WS and the drain electrode WD contact the semiconductor layer SC in contact holes which penetrate the insulating layer 33 down to the semiconductor layer SC.

The gate electrode WG is formed of a metal material such as aluminum (Al), titanium (Ti), silver (Ag), molybdenum (Mo), tungsten (W), copper (Cu) or chromium (Cr) or an alloy of these metal materials, etc., and may have a single layer structure or a multilayer structure. As the material of the source electrode WS and the drain electrode WD, the above-described metal materials are applicable. The insulating layers 31 to 33 are formed of an inorganic insulating material such as silicon oxide, silicon nitride or silicon oxynitride.

The switching element SW1 is covered with an insulating layer 34. The insulating layer 34 is formed of a transparent organic insulating material such resin, for example.

The organic EL elements OLED are formed on the insulating layer 34. In the example illustrated, each organic EL element OLED is the so-called top emission type organic EL element which emits light to the opposite side to the basement 30 but not necessarily limited to this example and may be the so-called bottom emission type organic EL element which emits light to the basement 30 side. The organic EL element OLED1 is electrically connected to the switching element SW1, the organic EL element OLED2 is electrically connected to the switching element SW2, and the organic EL element OLED3 is electrically connected to the switching element SW3. All the organic EL elements OLED1 to OLED3 have the same structure. An example of the structure, the structure of the organic EL element OLED1 will be described below.

The organic EL element OLED1 is composed of a pixel electrode PE1, the common electrode CE, and an organic light-emitting layer ORG1.

The pixel electrode PE1 is provided on the insulating layer 34. The pixel electrode PE1 functions as, for example, the anode of the organic EL element OLED1. The pixel electrode PE1 contacts the drain electrode WD of the switching element SW1 and is electrically connected to the switching element SW1 in a contact hole provided in the insulating layer 34. The organic light-emitting layer ORG1 is formed on the pixel electrode PE1. The organic light-emitting layer ORG1 may further include an electron-injection layer, a hole-injection layer, an electron-transport layer, a hole-transport layer, etc., to improve light emission efficiency. The common electrode CE is formed on the organic light-emitting layer ORG1. The common electrode CE functions as, for example, the cathode of the organic EL element OLED1. The common electrode CE and the pixel electrodes PE are formed of a transparent conductive material such as indium tin oxide (ITO) or indium zinc oxide (IZO). The organic EL element OLED1 structured as described above emits light at luminous intensity in accordance with voltage (current) applied between the pixel electrode PE1 and the common electrode CE.

As shown in FIG. 22, in the case of a top-emission type organic EL element, the organic EL element OLED1 should preferably include the reflective layer RL between the insulating layer 34 and the pixel electrode PE1. The reflective layer RL is formed of a highly reflective metal material such as silver. A reflective surface of the reflection layer RL, that is, a surface of the reflection layer RL on the organic light-emitting layer ORG1 side may be flat as shown in the drawing or may have recesses and projections to have light diffusion properties.

For example, the organic light-emitting layer ORG1 provided in the organic EL element OLED1 emits blue light, an organic light-emitting layer ORG2 provided in the organic EL element OLED2 emits green light, and an organic light-emitting layer ORG3 provided in the organic EL element OLED3 emits red light. The organic EL elements OLED are partitioned with an insulating layer (rib) 35 formed of an organic insulating material. That is, the organic light-emitting layers ORG1, ORG2 and ORG3 contact the pixel electrodes PE1, PE2 and PE3 between the insulating layer 35 and the insulating layer 35. Although not shown in the drawing, the organic EL elements OLED should preferably be sealed with a transparent sealing film.

The second substrate SUB2 includes a basement 40, a color filter layer 220, etc. The basement 40 is formed of an organic insulating material such as polyimide, for example. The basement 40 may include an optical film, a polarizer, etc.

The color filter layer 220 is arranged on an inner surface 40A side of the basement 40. The color filter layer 220 includes a color filter CF1, a color filter CF2 and a color filter CF3. The color filters CF1, CF2, and CF3 are formed of resin materials of different colors. For example, the color filter CF1 is a blue color filter, the color filter CF2 is a green color filter, and the color filter CF3 is a red color filter. The color filter layer 220 may further include a white or transparent color filter. The color filters CF1, CF2, and CF3 are opposed to the organic EL elements OLED1, OLED2, and OLED3, respectively. The color filters may be omitted.

The first substrate SUB1 and the second substrate SUB2 are attached to each other by a transparent adhesive 41 in the area A1. Further, the first substrate SUB1 and the second substrate SUB2 may also be attached to each other by a sealant which surrounds the adhesive 41 in the non-display areas in addition to the adhesive 41.

The same effect as that produced from the example shown in FIG. 3 can be produced from the ninth modification.

In the present embodiment, the liquid crystal element LC and the organic EL element OLED correspond to the display element. The basement 10 and the basement 30 correspond to the first basement. The area A1 corresponds to the first area, the area A2 corresponds to the second area, and the area A3 corresponds to the third area. Further, the area A6 corresponds to the fourth area. The folding line FL1 corresponds to the first folding line, the folding line FL2 corresponds to the second folding line, the folding line FL5 corresponds to the third folding line, and the folding line FL6 corresponds to the fourth folding line. Still further, the folding line FL17 corresponds to the fifth folding line. The source driver SD corresponds to the first driver, and the gate driver GD2 corresponds to the second driver. The edge E2a corresponds to the first edge, and the edge E3a corresponds to the second edge. The mounting portion MT1 corresponds to the first mounting portion, and the mounting portion MT2 corresponds to the second mounting portion. The wiring line WL1 corresponds to the first wiring line. The wiring line WL4a corresponds to the second wiring line, and the wiring line WL4b corresponds to the third wiring line. The sealant SE corresponds to a frame body. The insulating layer 12 corresponds to the first organic insulating layer, and the insulating layer 14 corresponds to the second organic insulating layer. The reserve display area B2 corresponds to the first reserve display area, and the reserve display area B3 corresponds to the second reserve display area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a first basement having a first area which is a display area including a display element, and a second area and a third area which are non-display areas and are adjacent to the first area;
   a first folding line located at a border of the first area and the second area; and
   a second folding line located at a border of the first area and the third area, wherein
   the first folding line extends in a first direction,
   the second folding line extends in a second direction intersecting the first direction,
   the second area has a first edge on an opposite side to the first area,
   the third area has a second edge on an opposite side to the first area,
   a length of the first edge in the first direction is less than a length of the first folding line,
   a length of the second edge in the second direction is less than a length of the second folding line, and the first edge and the second edge are connected by a straight line without a gap.

2. The display device of claim 1, further comprising a first driver and a second driver which drive the display element, wherein
the first driver is located in the second area, and
the second driver is located in the third area.

3. The display device of claim 1, further comprising:
a third folding line which is located in the second area and extends in the first direction;
a fourth folding line which is located in the third area and extends in the second direction.

4. The display device of claim 1, wherein
the first edge and the second edge are located directly below the first area.

5. The display device of claim 4, wherein the first edge and the second edge do not overlap each other.

6. The display device of claim 1, further comprising a first driver and a second driver which drive the display element, wherein
the first driver is located between the third folding line and the first edge, and
the second driver is located between the fourth folding line and the second edge.

7. The display device of claim 6, further comprising:
a first mounting portion including a terminal which is electrically connected to the first driver; and
a second mounting portion including a terminal which is electrically connected to the second driver.

8. The display device of claim 1, wherein
the second area does not extend beyond the second folding line in the first direction, and
the third area does not extend beyond the first folding line in the second direction.

9. The display device of claim 1, wherein
the first basement has a fourth area which is adjacent to the second area and the third area, and an opening which is located at an intersection of the first folding line and the second folding line.

10. The display device of claim 1, further comprising a first wiring line which is electrically connected to the display element, wherein
the first wiring line extends from the second area to the third area through the first area.

11. The display device of claim 10, further comprising a frame body which passes through the second area, the first area and the third area.

12. The display device of claim 10, further comprising a first wiring line which is electrically connected to the display element, wherein
the first basement has a fourth area which is adjacent to the second area and the third area, and
the first wiring line passes through the fourth area.

13. The display device of claim 12, further comprising a first organic insulating layer and a second organic insulating layer which are located at least in the fourth area, wherein
the first wiring line is located between the first organic insulating layer and the second organic insulating layer in the fourth area.

14. The display device of claim 12, further comprising:
a second wiring line formed in the fourth area;
a third wiring line which is formed in the fourth area and differs in electric potential from the second wiring line; and
a fifth folding line located in the fourth area, wherein
the second wiring line and the third wiring line do not overlap each other in an area which overlaps the fifth folding line.

15. The display device of claim 12, further comprising a frame body which surrounds the first area and passes through the second area, the third area and the fourth area.

16. The display device of claim 10, wherein the first folding line and the second folding line are downward folding lines.

17. The display device of claim 10, wherein the first basement has an octagon shape.

18. The display device according to claim 10, a sealant intersects each of the first folding line and the second folding line twice.

19. A display device comprising:
a first basement having a first area which is a display area including a display element, and a second area and a third area which are non-display areas and are adjacent to the first area;
a second basement opposed to the first basement;
a sealant attaching the first basement and the second basement;
a liquid crystal layer located within an area surrounded by the sealant;
a first folding line located at a border of the first area and the second area; and
a second folding line located at a border of the first area and the third area, wherein
the first folding line extends in a first direction,
the second folding line extends in a second direction intersecting the first direction,
the second area has a first edge on an opposite side to the first area,
the third area has a second edge on an opposite side to the first area,
the first edge and the second edge are connected by a straight line without a gap,
a length of the first edge in the first direction is less than a length of the first folding line,
a length of the second edge of in the second direction is less than a length of the second folding line,
the sealant is located between the first folding line and the first edge, and between the second folding line and the second edge, and
the liquid crystal layer is located between the first folding line and a first portion of the sealant which extends along the first direction, and between the second folding line and a second portion of the sealant which extends along the second direction.

20. The display device of claim 19, wherein the sealant overlaps the first area.

21. The display device according to claim 19, the sealant intersects each of the first folding line and the second folding line twice.

* * * * *